(12) United States Patent
Takashima

(10) Patent No.: US 6,807,085 B2
(45) Date of Patent: Oct. 19, 2004

(54) NONVOLATILE SEMICONDUCTOR MEMORY DEVICE HAVING FERROELECTRIC CAPACITORS

(75) Inventor: Daisaburo Takashima, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 10/801,562

(22) Filed: Mar. 17, 2004

(65) Prior Publication Data

US 2004/0174730 A1 Sep. 9, 2004

Related U.S. Application Data

(62) Division of application No. 10/607,301, filed on Jun. 27, 2003, now Pat. No. 6,735,107, which is a division of application No. 10/279,910, filed on Oct. 25, 2002, now Pat. No. 6,625,053, which is a division of application No. 09/902,168, filed on Jul. 11, 2001, now Pat. No. 6,507,510.

(30) Foreign Application Priority Data

Jul. 11, 2000 (JP) ........................................ 2000-210474

(51) Int. Cl.[7] ............................ G11C 11/22; G11C 5/06; G11C 7/00; G11C 8/00; G11C 11/04
(52) U.S. Cl. ........................... 365/145; 365/65; 365/72; 365/139; 365/189.03; 365/230.03; 365/230.06
(58) Field of Search .............................. 365/145, 139, 365/65, 189.03, 72, 230.03, 230.06

(56) References Cited

U.S. PATENT DOCUMENTS

| | | |
|---|---|---|
| 5,894,447 A | 4/1999 | Takashima |
| 5,903,492 A * | 5/1999 | Takashima ................ 365/145 |
| 6,088,286 A | 7/2000 | Yamauchi et al. |
| 6,320,783 B1 | 11/2001 | Kang et al. |
| 6,459,118 B1 | 10/2002 | Kang |

OTHER PUBLICATIONS

K. Noda et al., "A Boosted Dual Word–line Decoding Scheme for 256Mb DRAMs" Symposium on VLSI Circuits Digest of Technical Papers; pp. 112–113; 1992.

M. Nakamura et al., "A 29ns 64Mb DRAM with Hierarchical Array Architecture" IEEE International Solid–State Circuits Conference, pp. 246–247, 1995.

* cited by examiner

Primary Examiner—David Nelms
Assistant Examiner—Ly Duy Pham
(74) Attorney, Agent, or Firm—Banner & Witcoff, Ltd.

(57) ABSTRACT

A memory cell array is constructed by a plurality of sub-arrays which include a plurality of sub-word lines, a plurality of bit lines, a plurality of plate lines and a plurality of memory cell blocks, plural ones of the sub-arrays being arranged in the sub-word line direction, a plurality of sub-row decoders provided between the plurality of respective sub-arrays, for driving the sub-word lines, a main row decoder disposed on one-end side of the plurality of sub-arrays in the sub-word line direction, and a plurality of main-block selecting lines for respectively supplying outputs of the main row decoder to the sub-row decoders. The main-block selecting lines for connecting the main row decoder to the sub-row decoders are formed of the same interconnection layer as the plate lines and metal interconnections used between the memory cells in the cell block.

1 Claim, 30 Drawing Sheets

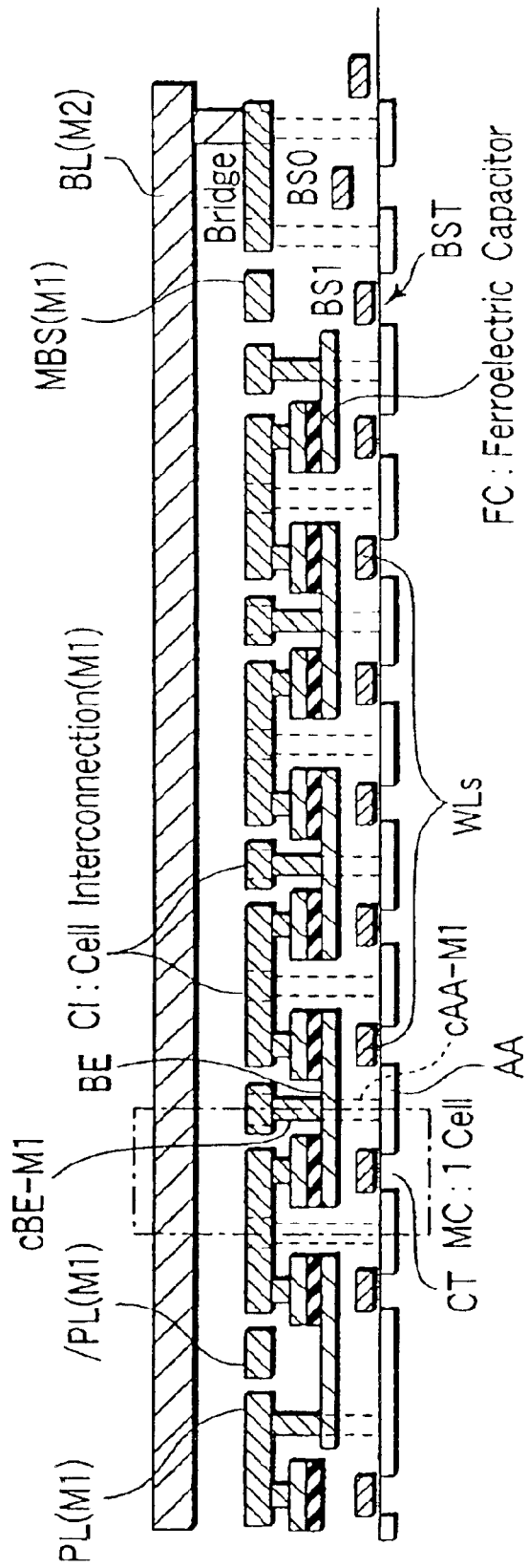
F I G. 10

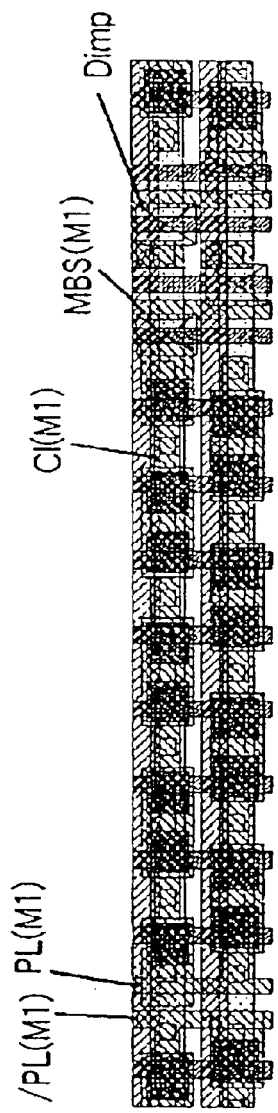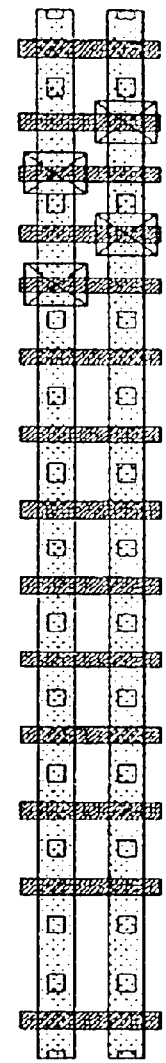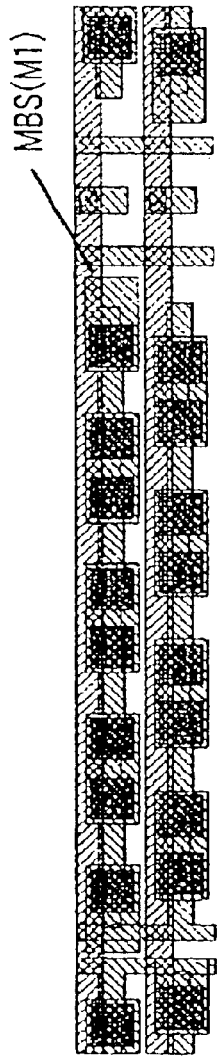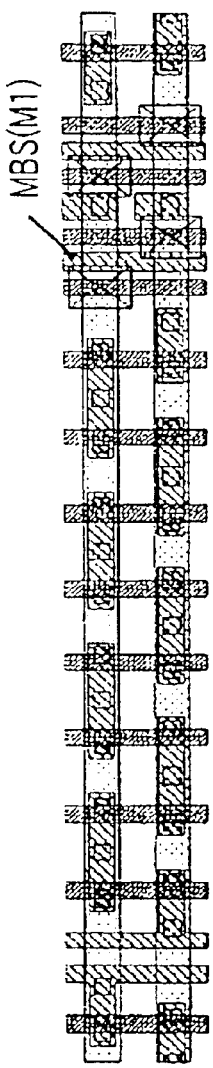
F I G. 16A   F I G. 16B   F I G. 16C   F I G. 16D

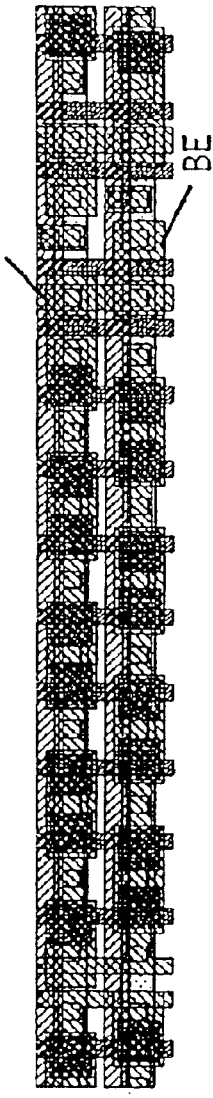
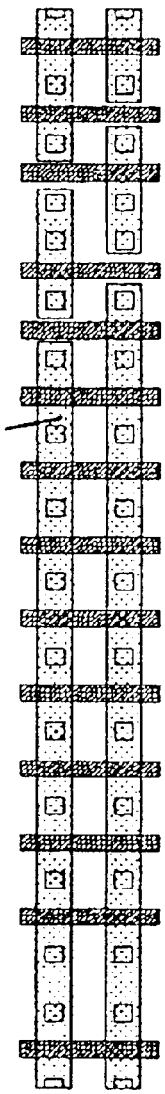
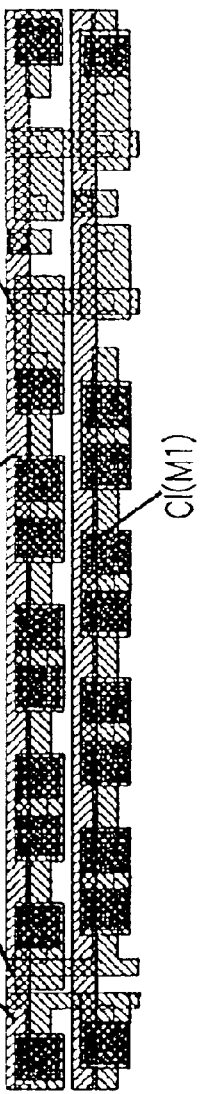
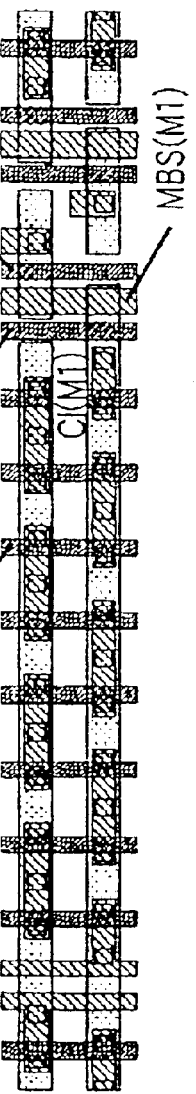
FIG. 19A
FIG. 19B
FIG. 19C
FIG. 19D

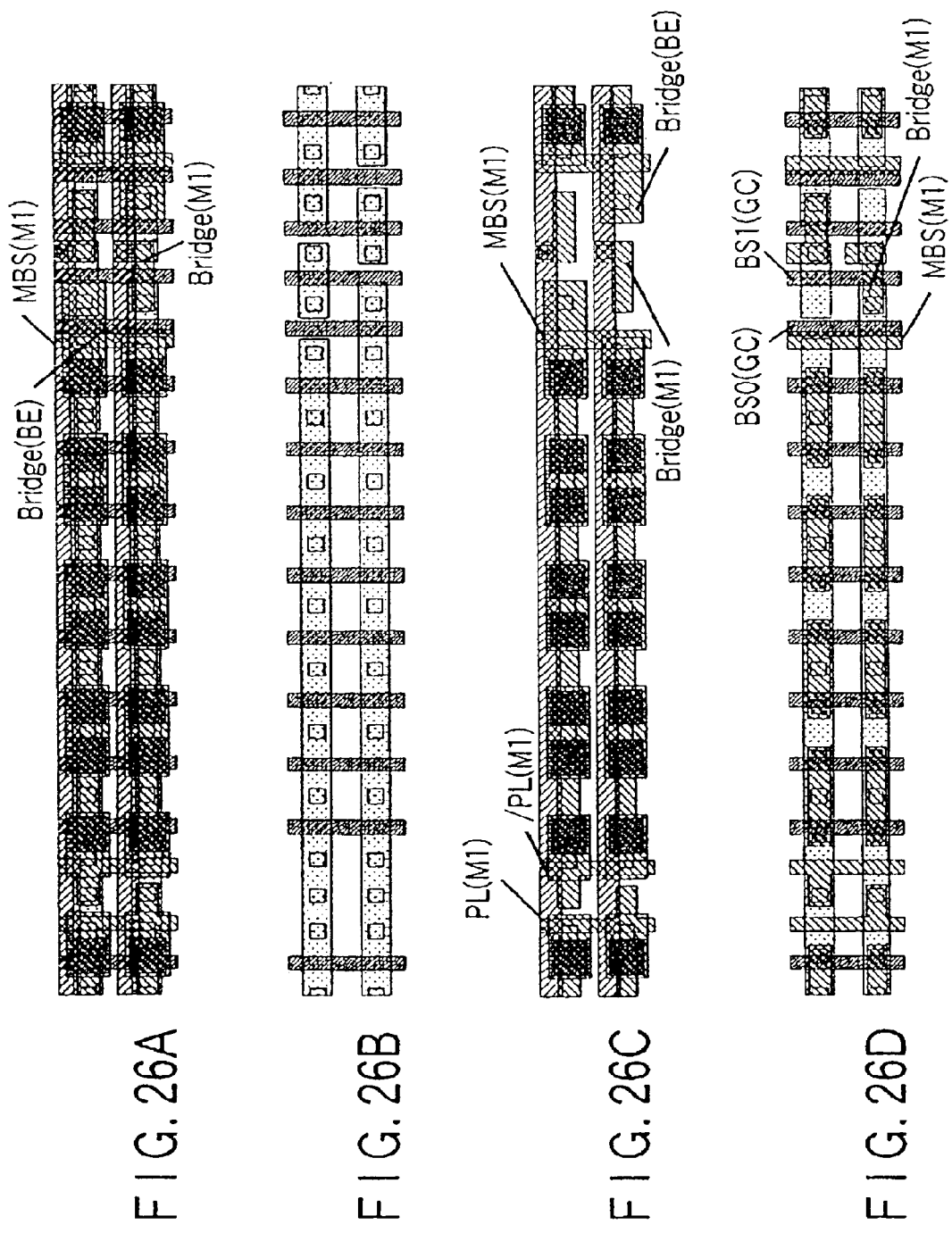
F I G. 26A
F I G. 26B
F I G. 26C
F I G. 26D

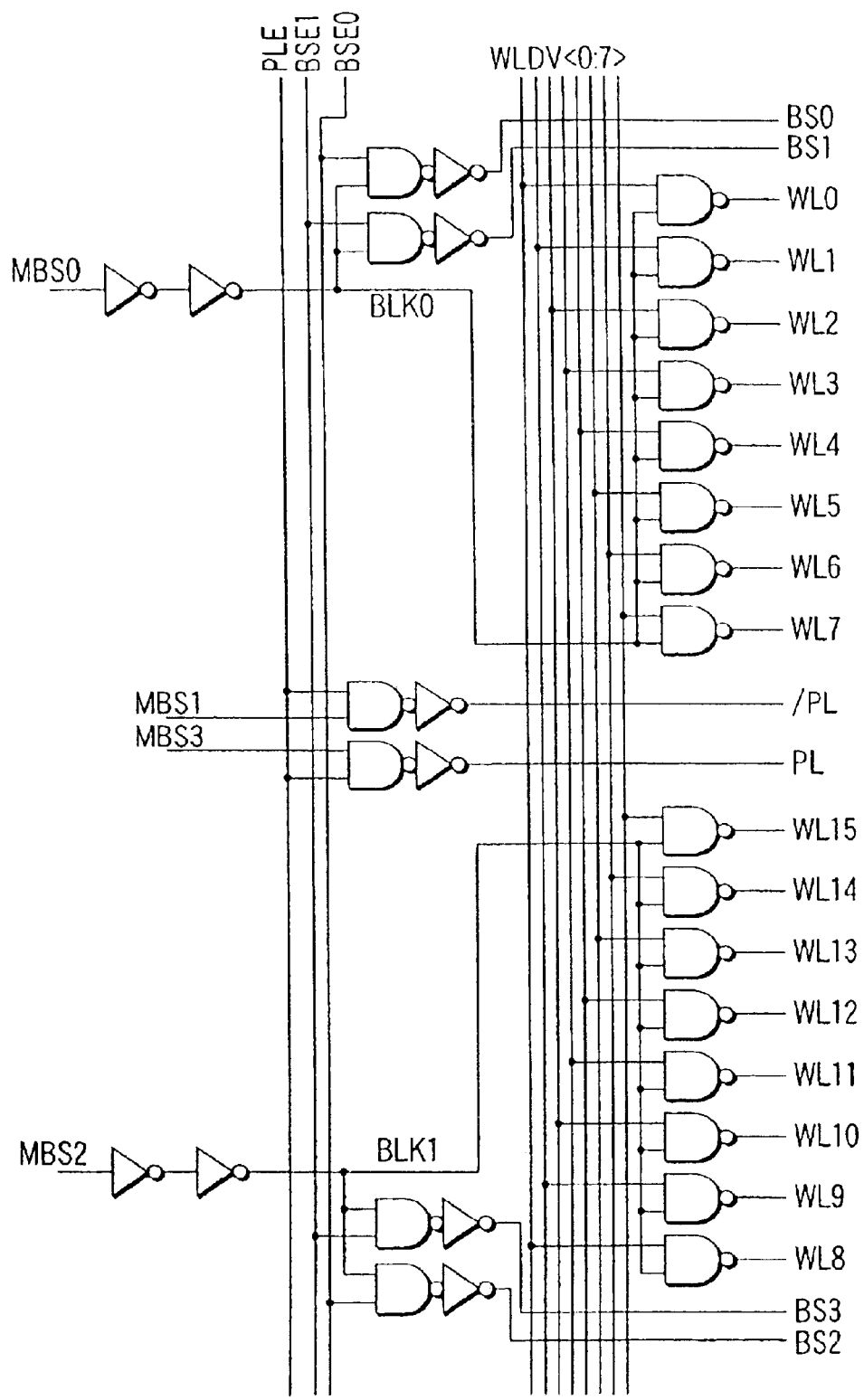
F I G. 32

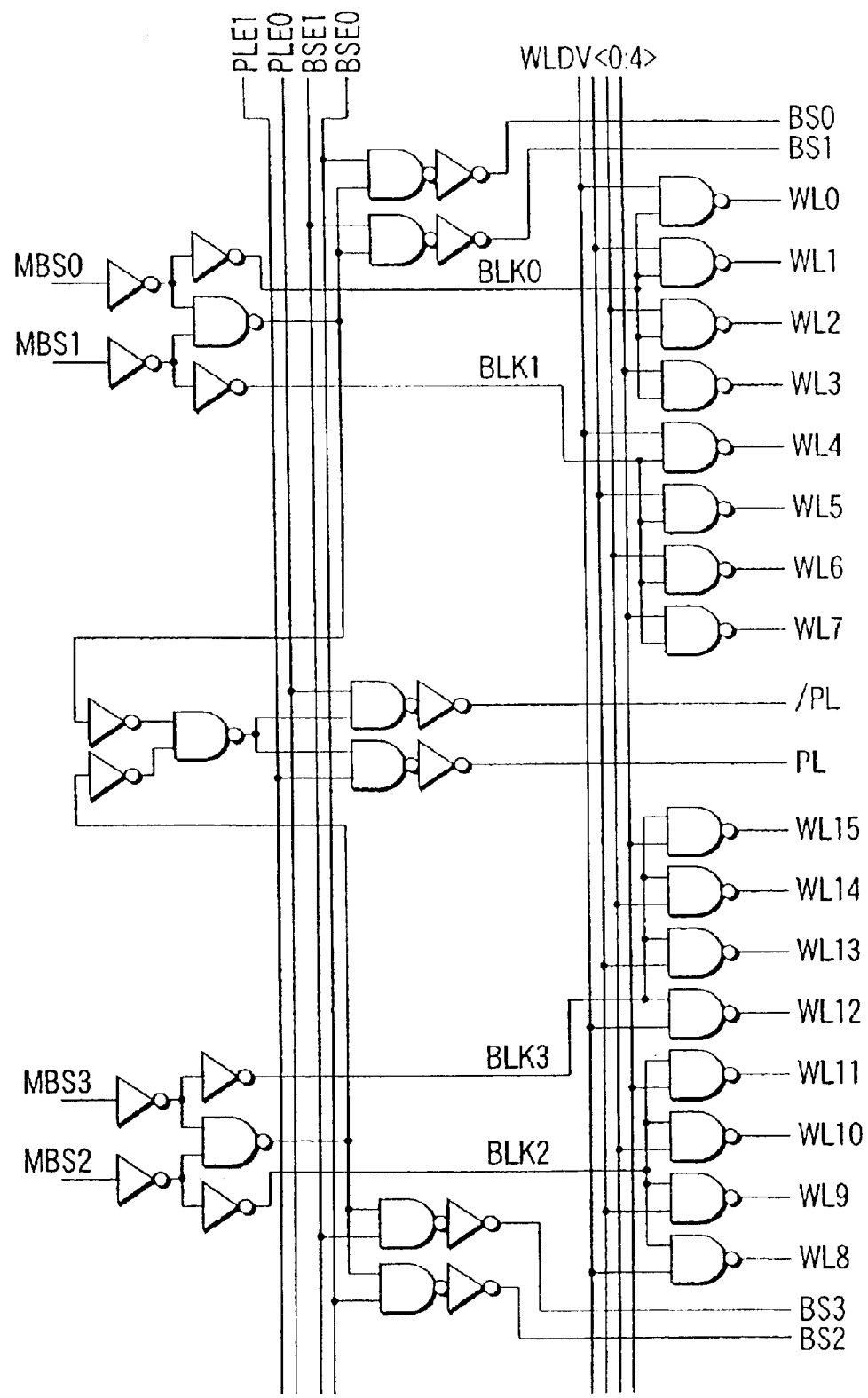
F I G. 33

NONVOLATILE SEMICONDUCTOR MEMORY DEVICE HAVING FERROELECTRIC CAPACITORS

CROSS-REFERENCE TO RELATED APPLICATIONS

This application is a Divisional of U.S. application Ser. No. 10/607,301 filed Jun. 27, 2003 now U.S. Pat. No. 6,735,107; which is a Divisional of U.S. application Ser. No. 10/279,910 filed on Oct. 25, 2002 now U.S. Pat. No. 6,625,053; which is a Divisional of U.S. application Ser. No. 09/902,168 filed on Jul. 11, 2001 now U.S. Pat. No. 6,507,510 hereby incorporated by reference as to its entirety. This application is based upon and claims the benefit of priority from the prior Japanese Patent Application No. 2000-210474, filed Jul. 11, 2000, the entire contents of which are incorporated herein by reference.

BACKGROUND OF THE INVENTION

This invention relates to a semiconductor memory device and more particularly to a nonvolatile semiconductor memory device having ferroelectric capacitors.

Recently, semiconductor memories are widely used in various portions such as the main storages of large-scale computers, personal computers, domestic products, portable telephones and the like. As the types of semiconductor memories, a volatile DRAM (Dynamic RAM) and SRAM (Static RAM), nonvolatile MROM (Mask ROM) and flash $E^2$PROM are on the market. Particularly, even though DRAM has a defect in which information cannot be maintained when the power supply is cut off since it is a volatile memory, it is excellent in its low cost (the cell area is ¼ times that of an SRAM) and high operation speed (in comparison with flash $E^2$PROM) and DRAMs have a dominant share of the market. The flash $E^2$PROM which is a rewritable nonvolatile memory can maintain information even if the power supply is cut off, but since it has a defect in which the number of rewriting operations (W/E number) is only approx. 10 to the sixth power, the write time is approx. some microseconds and an application of high voltage (12V to 22V) is required for data writing, flash $E^2$PROMs do not dominate the market as much as DRAMs.

Since a nonvolatile memory (ferroelectric RAM) having ferroelectric capacitors has various advantages that it is nonvolatile, the number of rewriting operations is 10 to the twelfth power, the readout/write time is approximately equal to that of DRAM and the operation voltage is 3V to 5V, it may take the lion's share of the memory market and various makers have developed ferroelectric RAMs since they were proposed in 1980.

FIG. 1 shows a memory cell with the construction of one transistor and one capacitor in the conventional ferroelectric memory and a cell array construction. The construction of the memory cell MC in the conventional ferroelectric memory is obtained by connecting the current path of a cell transistor CT in series with a cell capacitor (ferroelectric capacitor) FC. A cell array CA includes bit lines BL, /BL for reading out data, word lines WL0, WL1 for selecting the cell transistors CT, and plate lines PL0, PL1 for driving one-side electrodes of the ferroelectric capacitors FC. A row decoder (more precisely, row decoder and plate driver) RD for driving the word lines WL0, WL1 and plate lines PL0, PL1 is arranged on one end of the cell array CA.

FIG. 2 shows an example of the structure of the memory cell MC. The ferroelectric capacitors FC includes a bottom electrode BE (plate electrode PL), ferroelectric material film FE and top electrode TE and the top electrode TE is connected to a metal interconnection M1 via a contact TW. The metal interconnection M1 is connected to an active area AA used as the drain of the cell transistor CT via a contact AW. Another active area AA used as the source of the cell transistor CT is connected to a metal interconnection M1 via a contact AW and the metal interconnection M1 is connected to a bit line /BL formed of a metal interconnection M2 by a contact VIA.

With the cell array construction of FIG. 1 and the memory cell structure of FIG. 2, the following problem occurs. That is, since the word lines WL0, WL1 are formed by extending the gate electrodes of the cell transistors CT, it is difficult to form gate interconnection layers with low resistance, and as a result, the sheet resistance thereof becomes several ohms/□ or more. Therefore, if an attempt is made to reduce the chip size by increasing the area of the memory cell array mat and lowering the ratio of the area of the row decoder RD, an amount of gate delay becomes excessively large. Likewise, since the plate lines PL0, PL1 are formed of a material such as Pt, Ir, $IrO_2$, Ru, StRuO, the sheet resistance thereof becomes several ohms/□) or more. Therefore, if an attempt is made to reduce the chip size by increasing the area of the memory cell array mat and lowering the ratio of the area of the row decoder RD, an amount of delay by the plate lines PL0, PL1 becomes excessively large.

In order to solve the above problem, a word line shunt system used in the DRAM or the like or a hierarchical word line system shown in FIG. 3 may be used.

FIG. 3 is a block diagram showing a cell array of a ferroelectric memory using the hierarchical word line system. The cell array CA is divided into a plurality of sub-cell arrays SCA and sub-row decoders (sub RD) SRD are respectively disposed for the sub-cell arrays SCA. A circuit for driving sub-word lines SWL0 to SWL3 used as the gates of the memory cell transistors in the sub-array SCA is arranged in the sub-row decoder SRD. On one-end side of the cell array CA, a main row decoder (main RD) MRD is disposed and main word lines MWL0, MWL1 are formed to extend from the main row decoder MRD over the cell array CA and connected to each of the sub-row decoders SRD. The sub-row decoders SRD derive the logical product of signals supplied via the main word lines MWL0, MWL1 and signals (word line driving signals) selectively supplied via word line driving signal lines WDV0 to WDV7 to generate driving signals SWL0 to SWL3. For example, when the signal of the main word line MWL0 is at the high level and the signal of the word line driving signal line WDV0 is set at the high level, the signal of the sub-word line SWL0 is set to the high level.

With the above construction, only a simple decode circuit and driver circuit are arranged in each of the sub-row decoders SRD and a decode circuit for selecting one of a plurality of main word lines MWLi (i=0, 1, . . . ) according to an external address can be commonly arranged in the main row decoder MRD. As a result, the number of row decoder circuits can be reduced in comparison with the cell array construction shown in FIG. 1, the area of the sub-row decoder SRD can be reduced and the chip size can be reduced while the operation speed is maintained. Likewise, the area of the sub-row decoder SRD in the plate line driving circuit can be reduced.

However, in the above system, as shown in the cross sectional view of the memory cell MC in FIG. 4, only a structure in which a metal interconnection M3 is newly formed above the metal interconnection M2 and the main word line MWL is formed to extend to various portions can be used, and as a result, an additional process step of forming the metal interconnection layer is necessary, which raises the production costs.

Thus, in the conventional ferroelectric memory, there occurs a problem that the chip area increases if the hierarchical word line system is not used and the process cost rises if the hierarchical word line system is used.

The inventor of the present application has proposed a new ferroelectric memory which is nonvolatile and simultaneously attains the three features of (1) small memory cells of $4F^2$ size, (2) plane transistors which can be easily formed and (3) highly flexible random access function in Jpn. Pat. Appln. KOKAI Publication No. 10-255483 (U.S. Pat. No. 5,903,492 and U.S. Pat. No. 6,094,370 which were filed based on the prior application used as part of the basic application and are now pending) which is a prior application of the present application.

FIGS. 5A and 5B show examples of the construction and operation of the ferroelectric memory relating to the prior application. In the prior application, each memory cell MC is constructed by connecting the current path of a cell transistor CT in parallel with a ferroelectric capacitor FC. One memory cell block MCB is constructed by serially connecting a plurality of parallel-connected memory cells MC, connecting one end thereof to a bit line /BL or BL via a block selection transistor BST and connecting the other end thereof to a plate line PL or /PL. The ON/OFF states of the cell transistors CT are controlled by selectively driving word lines WL0 to WL7 by outputs of a row decoder RD. The ON/OFF state of the block selection transistor BST is controlled by selectively driving a block selecting line BS0, BS1 by an output of the row decoder RD. The plate lines PL, /PL are driven by a plate driver (PL driver) PLD. A potential difference between the potentials of the bit lines /BL and BL is amplified by a sense amplifier SA. With this construction, a memory cell with minimum size of $4F^2$ can be realized by use of plane transistors.

With the above construction, when in standby, all of the word lines WL0 to WL7 are set at the high level to set the cell transistors CT in the ON state and the block selecting lines BS0, BS1 are set at the low level to turn OFF the block selection transistors BST. Thus, since both ends of each ferroelectric capacitor FC are short-circuited by the cell transistor CT which is set in the ON state, no potential difference occurs between both ends of the ferroelectric capacitor FC and storage polarization is stably maintained.

On the other hand, when active, only the memory cell transistor CT which is connected in parallel with the ferroelectric capacitor FC subjected to readout is turned OFF and the block selection transistor BST is turned ON. For example, if the ferroelectric capacitor C1 shown in FIG. 5A is selected as the memory cell capacitor FC, the word line WL6 is set to the low level as shown in FIG. 5B. After this, the potential difference between the plate line /PL and the bit line /BL is applied only across the ferroelectric capacitor FC which is connected in parallel with the memory cell transistor CT set in the OFF state by setting the plate line /PL to the high level and setting the block selecting line BS0 to the high level and polarization information of the ferroelectric capacitor C1 is read out to the bit line /BL. Thus, even if the memory cells MC are serially connected, cell information of a desired one of the ferroelectric capacitors FC can be read out by selecting a desired one of the word lines and complete random access can be attained.

However, the same problem as that occurring in the construction shown in FIGS. 1 to 4 occurs in the ferroelectric memories with various constructions disclosed in the prior application. The pattern layout of the memory cells in the circuit construction of FIG. 5A is shown in FIG. 6 and the cross section of FIG. 6 is shown in FIG. 7. In FIG. 7, only a high-resistance material can be used as a material of the gate electrode GC (gate interconnection) of the memory cell transistor, a metal interconnection M1 is used as the cell interconnection of the memory cell and a metal interconnection M2 is used as the bit lines BL, /BL. Therefore, if an attempt is made to apply the hierarchical word line system or hierarchical plate line system as shown in FIG. 3, then it becomes necessary to form a new metal interconnection M3 used as the main-block selecting line or main word lines MWL0, MWL1 as shown in FIG. 7.

If an attempt is made to apply the hierarchical word line system or hierarchical plate line system to reduce the chip area in the conventional semiconductor memory device, there occurs a problem that a new interconnection layer becomes necessary and the process cost rises.

The above problem can not be solved by use of the ferroelectric memory disclosed in the prior application for realizing high integration while maintaining simplification of the manufacturing method and the random access function, and if an attempt is made to apply the hierarchical word line system or hierarchical plate line system to reduce the chip area, a new interconnection layer becomes necessary and the process cost rises.

BRIEF SUMMARY OF THE INVENTION

Accordingly, an object of this invention is to provide a semiconductor memory device in which the hierarchical word line system or hierarchical block selecting line system can be applied to reduce the chip area and lower the process cost without increasing the number of interconnection layers.

Further, another object of this invention is to provide a semiconductor memory device capable of attaining high integration, further reducing the chip area and lowering the process cost while maintaining simplification of the manufacturing method and the random access function.

The above object can be attained by a semiconductor memory device comprising a memory cell array which includes a plurality of sub-arrays, a plurality of sub-row decoders provided between the plurality of sub-arrays, for driving a plurality of sub-word lines, a main row decoder disposed on one-end side of the plurality of sub-arrays in a sub-word line direction, and a plurality of main-block selecting lines for respectively supplying outputs of the main row decoder to the sub-row decoders; wherein the plurality of sub-arrays each include the plurality of sub-word lines, a plurality of bit lines, a plurality of plate lines and a plurality of memory cell blocks, the plurality of the sub-arrays are arranged in the sub-word line direction, the memory cell blocks each include a plurality of series-connected memory cells and at least one selection transistor serially connected to at least one end of the series-connected portion, one end of each of the memory cell blocks is coupled to a corresponding one of the bit lines, the other end thereof is connected to a corresponding one of the plate lines, the gate terminal of a cell transistor is connected to a corresponding one of the sub-word lines, the memory cell includes the cell transistor and a ferroelectric capacitor connected between the source and drain terminals of the cell transistor, and a metal interconnection used for parallel connection of the cell transistor and the ferroelectric capacitor is formed of a metal interconnection layer formed at the same level as the main-block selecting lines.

Further, the above object can be attained by a semiconductor memory device comprising a memory cell array which includes a plurality of sub-arrays, a plurality of sub-row decoders provided between the plurality of respective sub-arrays, for driving a plurality of sub-word lines, a main row decoder disposed on one end side of the plurality of sub-arrays in a sub-word, line direction, and a plurality of main-block selecting lines for respectively supplying outputs of the main row decoder to the sub-row decoders wherein the plurality of sub-arrays each include the plurality of sub-word lines, a plurality of bit/lines, a plurality of plate lines and a plurality of memory cell blocks, the plurality of the sub-arrays are arranged in the sub-word line direction, a metal interconnection used for forming the plate lines and a metal interconnection used for forming the main-block selecting lines are formed of metal interconnection layers at the same level, the memory cell blocks each include a plurality of series-connected memory cells and at least one selection transistor serially connected to at least one end of the series-connected portion, one end of each of the memory cell blocks is coupled to a corresponding one of the bit lines, the other end thereof is connected to a corresponding one of the plate lines, the gate terminal of each cell transistor is connected to a corresponding one of the sub-word lines, and the memory cell includes the cell transistor and a ferroelectric capacitor connected between the source and drain terminals of the cell transistor.

According to an aspect of the present invention, there is provided a semiconductor memory device comprising a memory cell array which includes a plurality of sub-arrays, a plurality of sub-row decoders provided between the plurality of respective sub-arrays, for driving a plurality of sub-word lines, a main row decoder disposed on one-end side of the plurality of sub-arrays in a sub-word line direction, and a plurality of main-block selecting lines for respectively supplying outputs of the main row decoder to the sub-row decoders; wherein the plurality of sub-arrays each include the plurality of sub-word lines, a plurality of bit lines, a plurality of plate lines and a plurality of memory cell blocks, the plurality of the sub-arrays are arranged in the sub-word line direction, a metal interconnection used for forming the plate lines and a metal interconnection used for forming the main-block selecting lines are formed of metal interconnection layers at the same level, the memory cell blocks each include a plurality of series-connected memory cells and at least one selection transistor serially connected to at least one end of the series-connected portion, one end of each of the memory cell blocks is coupled to a corresponding one of the bit lines, the other end thereof is connected to a corresponding one of the plate lines, the gate terminal of each cell transistor is connected to a corresponding one of the sub-word lines, the memory cell includes the cell transistor and a ferroelectric capacitor connected between the source and drain terminals of the cell transistor, and a metal interconnection used for parallel connection of the cell transistor and the ferroelectric capacitor is formed of a metal interconnection layer formed at the same level as the plate lines and the main-block selecting lines.

Further, the above object can be attained by a semiconductor memory device comprising a memory cell array which includes a plurality of sub-arrays, a plurality of sub-row decoders provided between the plurality of respective sub-arrays, for driving a plurality of sub-word lines, a main row decoder disposed on one-end side of the plurality of sub-arrays in a sub-word line direction, and a plurality of main-block selecting lines for respectively supplying outputs of the main row decoder to the sub-row decoders; wherein the plurality of sub-arrays each include the plurality of sub-word lines, a plurality of bit lines, a plurality of plate lines and a plurality of memory cell blocks, the plurality of the sub-arrays are arranged in the sub-word line direction, the memory cell blocks each include a plurality of series-connected memory cells and at least one selection transistor serially connected to at least one end of the series-connected portion, one end of each of the memory cell blocks is coupled to a corresponding one of the bit lines, the other end thereof is connected to a corresponding one of the plate lines, the gate terminal of each cell transistor is connected to a corresponding one of the sub-word lines, at least part of the main-block selecting lines is formed over the source, drain and gate electrode of the selection transistor, and the memory cell includes the cell transistor and a ferroelectric capacitor connected between the source and drain terminals of the cell transistor.

Further, the above object can be attained by a semiconductor memory device comprising a memory cell block having a plurality of series-connected memory cells and at least one selection transistor serially connected to at least one end of the series-connected portion, wherein one end of the memory cell block on the selection transistor side is connected to a bit line and the other end thereof is connected to a plate line, the memory cell includes a cell transistor and a ferroelectric capacitor connected between the source and drain terminals of the cell transistor, a bottom electrode of the ferroelectric capacitor of the memory cell connected to the plate line is connected to a diffusion layer via a contact between the bottom electrode and the diffusion layer, and the diffusion layer is connected to the plate line formed of a metal interconnection layer via a contact between the diffusion layer and the metal interconnection.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 10 is a cross sectional view of the ferroelectric memory of FIGS. 9A to 9D;

FIGS. 16A to 16D are cell block layout diagrams of a ferroelectric memory according to a third embodiment of this invention;

FIGS. 19A to 19D are cell block layout diagrams of a ferroelectric memory according to a sixth embodiment of this invention;

FIGS. 26A to 26D are cell block layout diagrams of a ferroelectric memory according to a ninth embodiment of this invention;

FIG. 32 is a circuit diagram of a sub-row decoder shown in FIG. 11;

FIG. 33 is a circuit diagram of a sub-row decoder according to another example of the circuit construction shown in FIG. 11.

DETAILED DESCRIPTION OF THE INVENTION

Figures 8A, 8B:
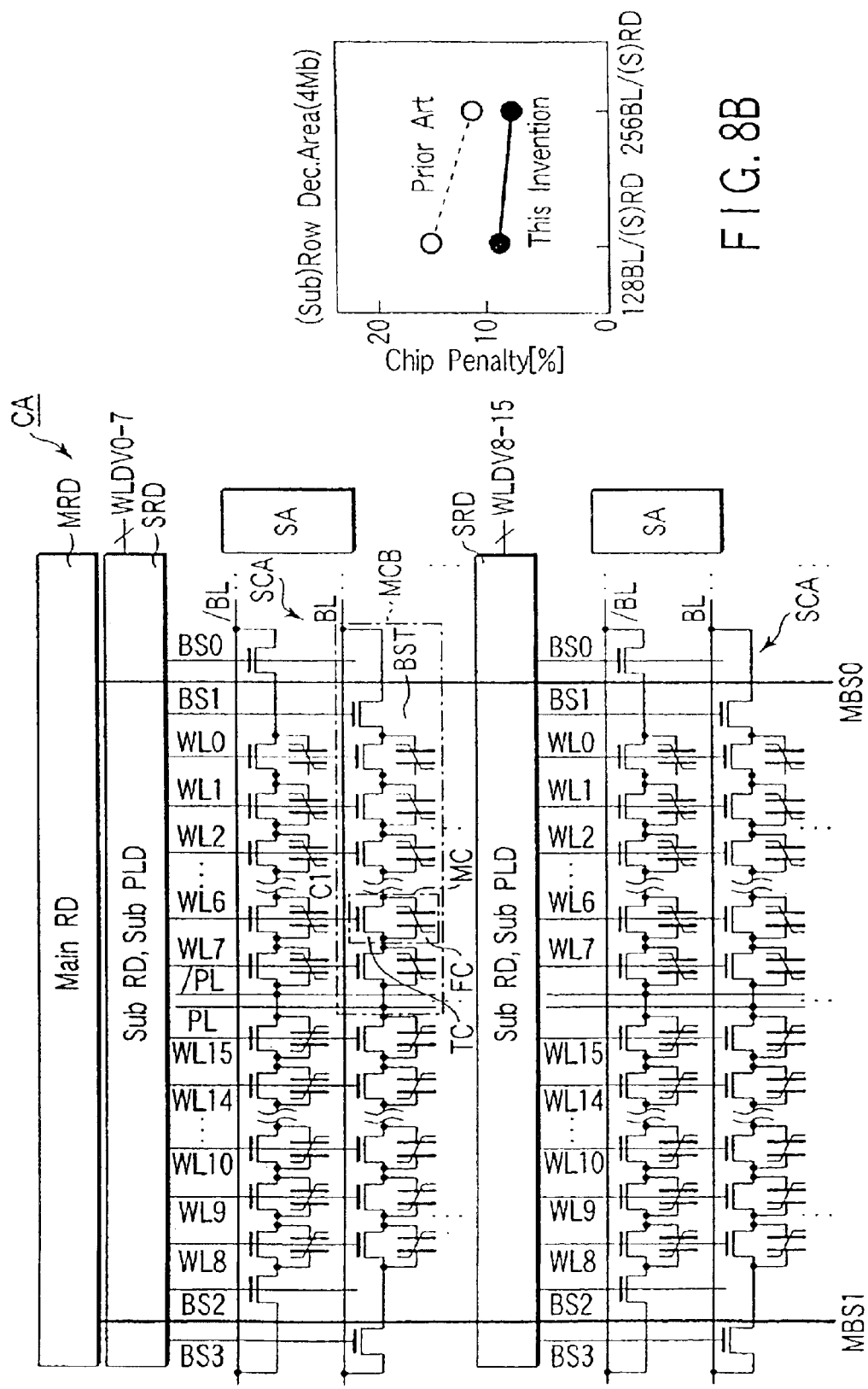
FIG. 8A is a circuit diagram showing the cell block circuit construction of a ferroelectric memory according to a first embodiment of this invention.
FIG. 8B is a diagram for illustrating the effect of the ferroelectric memory according to the first embodiment of this invention.

FIGS. 8A and 8B show a semiconductor memory device according to a first embodiment of this invention, FIG. 8A showing the circuit construction of the cell array of a ferroelectric memory and FIG. 8B showing the effect of the ferroelectric memory. As in U.S. Pat. No. 5,903,492 which is a prior application of the present application, in the present invention, one memory cell MC is constructed by a cell transistor CT and a ferroelectric capacitor FC connected in parallel with the cell transistor. One memory cell block MCB has a plurality of memory cells each having the same construction as the memory cell MC, one end thereof is connected to a bit line /BL or BL via a block selection transistor BST and the other end thereof is connected to a plate line PL or /PL. With this construction, a memory cell with a $4F^2$ size can be realized by the use of a plane transistor.

Further, as shown in FIG. BA, a memory cell array CA is divided into a plurality of sub-arrays SCA (in this example, it is divided into two sub-arrays) and sub-row decoders SRD are respectively provided for the sub-arrays SCA. In each of the sub-row decoders SRD, a circuit (Sub RD) for driving sub-word lines WL0 to WL15 and block selecting lines BS0 to BS3 connected to the memory cell blocks MCB in the sub-array SCA and a circuit (Sub PLD) for driving plate lines PL, /PL are provided. A main row decoder (Main RD) MRD is disposed on one-end side of the memory cell array CA in the sub-word line direction. Main block selecting lines (MBSi, i=0, 1, . . . ) for selecting one of the memory cell blocks MCB arranged in the bit line direction are formed to extend from the main row decoder MRD in the sub-word line direction and connected to the sub-row decoders SRD.

As shown in FIG. 8A, two types of the block selection transistors BST and block selecting lines BS0, BS1 (or BS2, BS3) are provided for the bit lines /BL and BL to attain a folded bit line configuration in which data of only one of the adjacent two memory cell blocks MCB is read out and supplied to the bit line when one of the block selecting lines BS0, DS1 (or BS2, BS3) is set to the high level and the other one of the paired bit lines is used as a reference bit line and thus a 1T/1C cell for storing one-bit data can be constructed by one cell transistor CT and one ferroelectric capacitor FC. Further, two types of plate lines (PL, /PL) are provided to prevent a voltage from being applied to the non-selected memory cell MC on the reference side by driving only the plate line on the selected bit line side.

The operation of the above construction is simply explained with attention paid to one of the memory cell blocks MCB. In standby, all of the sub-word lines WL0 to WL7 are set to the high level to turn ON the memory cell transistors CT and the block selecting lines BS0, BS1 are set to the low level to turn OFF the block selection transistors BST. As a result, since both ends of the ferroelectric capacitor FC are electrically short-circuited by the cell transistor CT which is set in the ON state, no potential difference occurs across the ferroelectric capacitor FC and the storage polarization can be stably held.

On the other hand, when active, only the memory cell transistor CT connected in parallel with the ferroelectric capacitor FC from which data is read out is turned OFF and the block selection transistor BST is turned ON. For example, if the ferroelectric capacitor C1 is selected as the memory cell capacitor FC in FIG. 8A, the sub-word line WL6 is set to the low level. Then, the plate line /PL on the ferroelectric capacitor C1 side is set to the high level and the block selecting line BS0 on the ferroelectric capacitor C1 side is set to the high level so that a potential difference between the plate line /PL and the bit line /BL will be applied only between the two terminals of the ferroelectric capacitor C1 connected in parallel with the memory cell transistor CT which is set in the OFF state, thereby permitting polarization information of the ferroelectric capacitor C1 to be read out to the bit line. Therefore, even if the memory cells MC are serially connected, cell information of a desired ferroelectric capacitor can be read out by selecting a desired one of the sub-word lines and thus complete random access can be attained.

With the above construction, it is not necessary to provide a decoder circuit for determining which one of the cell blocks MCB of the cell array CA is selected in the sub-row decoder SRD. The decoder circuit can be arranged in the main row decoder MRD commonly used by a plurality of sub-row decoders SRD, and as a result, the number of decoder circuits can be significantly reduced. Further, the main-block selecting lines MBSi can be formed by use of the same interconnection layer as an interconnection for connecting the ferroelectric capacitors FC to the respective cell transistors CT of the memory cells in the cell block and an interconnection for connecting the memory cells MC in the cell block MCB to one another and the hierarchical word line system and hierarchical block line system can be realized and the chip area can be reduced without increasing the number of interconnection layers or raising the process cost.

More specifically, as shown in FIG. 8A, the metal interconnection layer is formed along the sub-word line direction over the block selection transistors BST where the interconnection inside the cells and the interconnection (metal interconnection layer) between the cells in the cell block MCB are not necessary and used as the main-block selecting lines MBSi for the hierarchical word line system and hierarchical block line system. Further, by applying the present system, the sub-array size can be reduced by utilizing the effect that the area of the sub-row decoder SRD can be reduced without raising the process cost, and as a result, the power consumption can be lowered and a high operation speed can be attained by reducing the delay time in the sub-word lines and sub-plate lines.

FIG. 8B is a graph showing the effect of this invention, the abscissa indicates the number of bit lines intersecting with one sub-word line (the number of bit lines connected to a sub-word line driving circuit), that is, the number of bit lines intersecting with one sub-plate line (the number of bit lines connected to a sub-plate line driving circuit), and the ordinate indicates the amount of occupied areas of the sub-row decoders SRD and main row decoder MRD in the whole chip in this invention, and the amount of occupied area of the row decoder in a conventional chip.

As shown in FIG. 8B, it is understood that if 128 bit lines are connected to each (sub) word line driving circuit (128 BL/(S)RD), the chip size can be reduced by 5% without raising the process cost.

Although not shown in the drawing, the hierarchical block line system can be applied without raising the process cost when the above technique is applied to various modifications shown in the prior application of this application. For example, the present invention can be applied to a construction exclusively used for 2T2C having one kind of block selecting line and one kind of plate line.

Figure 9A:
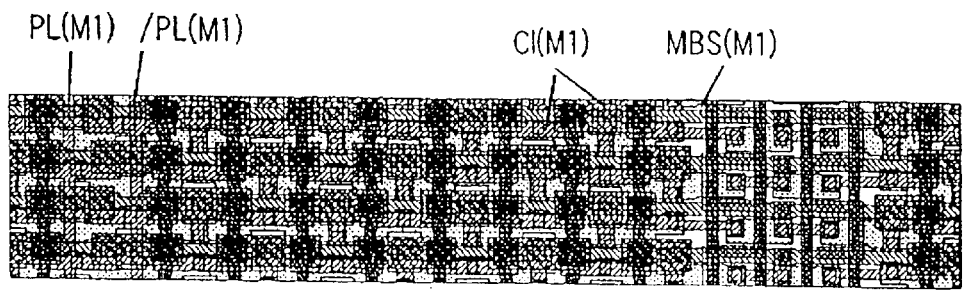
FIGS. 9A to 9D are cell block layout diagrams of a ferroelectric memory shown in FIG. 8A.
Figure 9B:
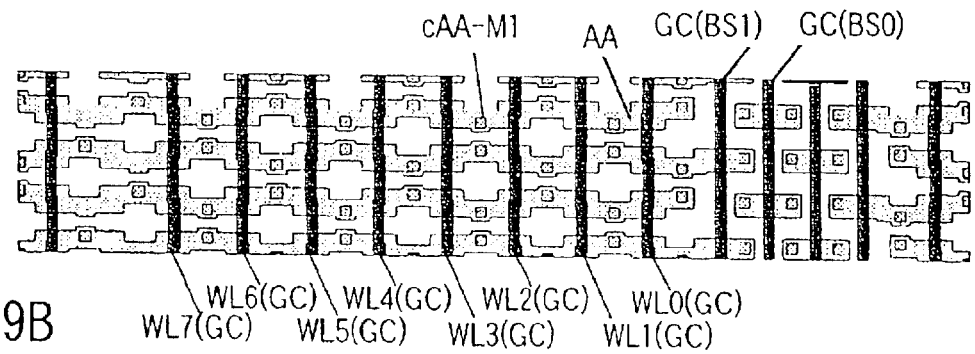
Figure 9C:
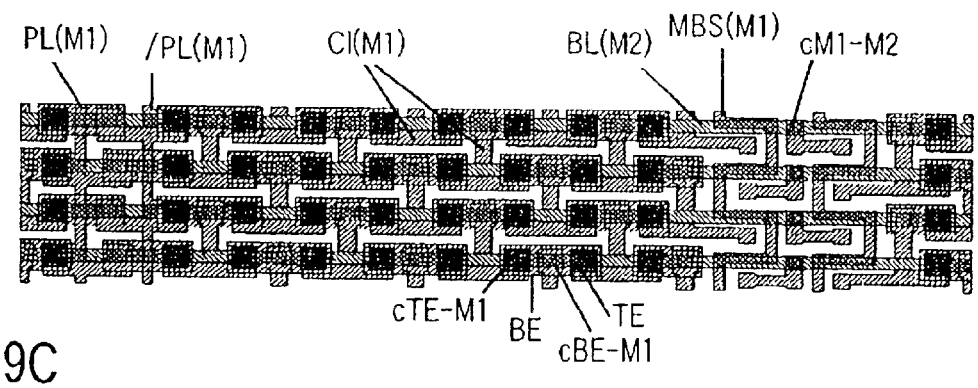
Figure 9D:
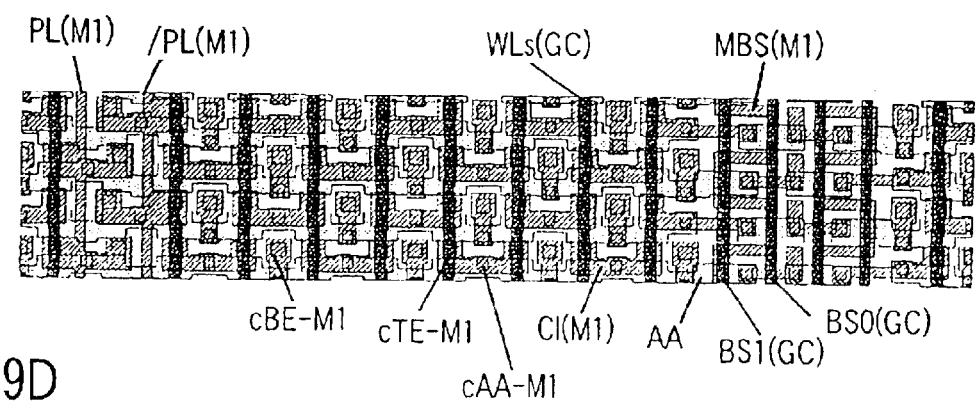

FIGS. 9A to 9D are layout diagrams of a cell block MCB indicating the structure of a ferroelectric memory shown in FIG. 8A. FIG. 9A shows the layout of the whole portion and FIGS. 9B to 9D show the layouts of portions thereof. In FIGS. 9A to 9D, WL1 (i=0, 1, 2, . . . ) indicates sub-word lines, C1 indicates cell interconnections inside the cells and between the cells in the cell block, BL indicates bit lines, MBS indicates main-block selecting lines, BS0, BS1 indicate block selecting lines and /PL, PL indicates sub-plate lines.

In FIG. 9B, as the layout layers, AA indicates a diffusion layer (active area), cAA-M1 indicates a contact between the diffusion area (active area) AA and a first metal interconnection M1 and GC indicates a gate layer (gate conductor) of a transistor.

In FIG. 9C, M1 indicates a first metal interconnection (Metal 1), M2 indicates a second metal interconnection (Metal 2), cM1-M2 indicates a contact between the first metal interconnection M1 and the second metal interconnection M2, TE indicates a top electrode of a ferroelectric capacitor, BE indicates a bottom electrode of the ferroelectric capacitor, cTE-ML indicates a contact between the top electrode of the ferroelectric capacitor and the first metal interconnection M1, and cBE-M1 indicates a contact between the bottom electrode of the ferroelectric capacitor and the first metal interconnection M1.

In FIG. 9D, AA indicates a diffusion layer (active area), cAA-M1 indicates a contact between the diffusion area (active area) AA and a first metal interconnection, GC indicates a gate layer (gate conductor) of a transistor, M1 indicates a first metal interconnection (Metal 1), cTE-M1 indicates a contact between the top electrode of the ferroelectric capacitor and the first metal interconnection, and cBE-M1 indicates a contact between the bottom electrode of the ferroelectric capacitor and the first metal interconnection M1.

FIG. 10 is a cross sectional view of the ferroelectric memory of FIGS. 9A to 9D. WLs (s=0, 1, . . . ) indicates sub-word lines, C1 indicates interconnections inside the cell and between the cells in the cell block, BL indicates bit lines, MBS indicates main-block selecting lines, BS0, BS1 indicate block selecting lines, /PL, PL indicate sub-plate lines, and reference symbols M1 and M2 within parentheses attached after the respective symbols respectively indicate first and second metal interconnections.

FIGS. 9A to 9D and 10 indicate an example of the construction in which the bottom electrode BE of the ferroelectric capacitor is connected to the metal interconnection M1 via the contact cBE-M1 and the metal interconnection M1 is connected to the active area AA of the cell transistor CT via the contact cAA-M1. In this case, by use of the metal interconnection M1 by utilizing an area in which no interconnection inside the cell is formed, sub-plate lines /PL, PL are formed and one main-block selecting line MBS is formed over the block selection transistor BST.

As shown in FIG. 9B, in order to attain the folded bit line configuration, two types of block selecting lines (BS0, BS1) are used. Since the block selecting line on the forward passage side three-dimensionally intersects with the gate layer GC over the field by use of the bridge of the metal interconnection M1, the main-block selecting line MBS in this embodiment is disposed in a zig-zag form to avoid the metal interconnection M1 of the bridge. Further, as shown in FIGS. 9A to 9D, the memory cells MC in this embodiment are shifted by one pitch of the sub-word lines WLs in the adjacent bit line direction. Therefore, the ferroelectric capacitor of an adjacent cell is not disposed in a position adjacent to the contact connected between the diffusion layer and the metal interconnection which is connected to the top electrode of the ferroelectric capacitor. Thus the cell size can be reduced. Further, the area of the plate line connecting section of the cell block can be reduced.

Figure 11:
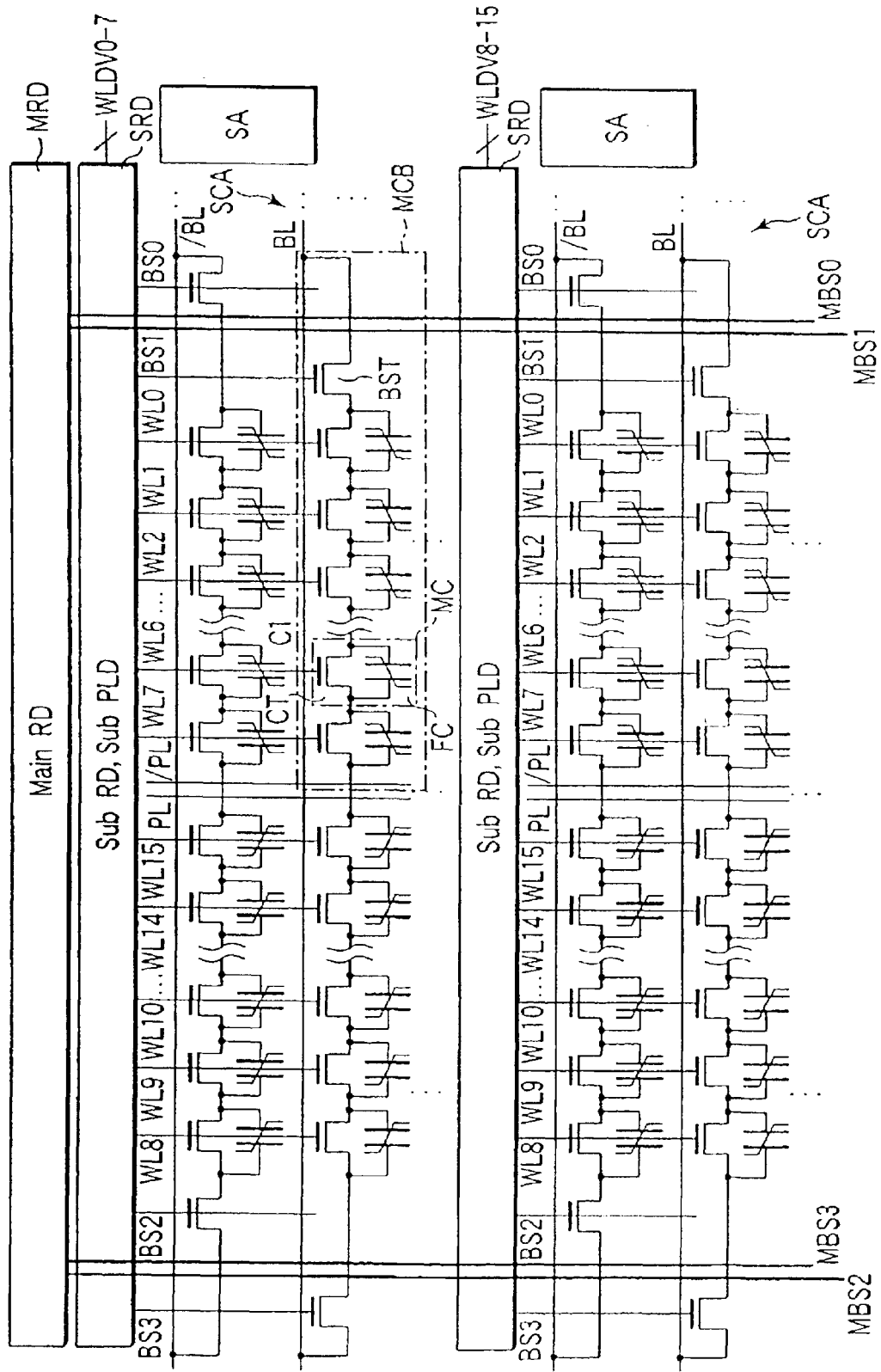
FIG. 11 is a circuit diagram showing the cell block circuit construction of a ferroelectric memory according to a second embodiment of this invention.
Figure 12B:
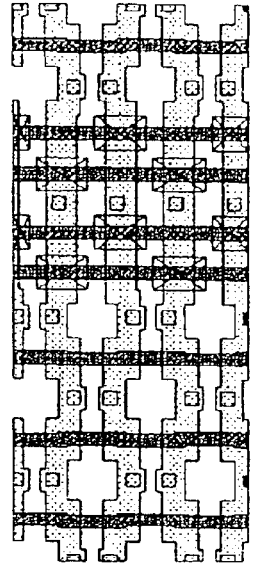
FIGS. 12A to 12D are part of the pattern layout of the cell block for realizing the circuit construction of FIG. 11.
Figure 12D:
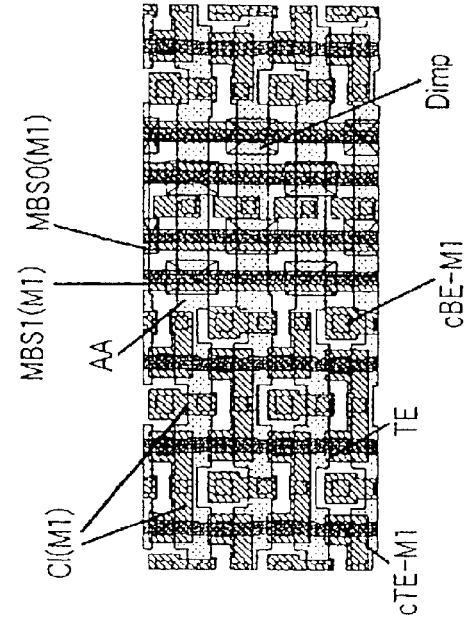
Figure 12A:
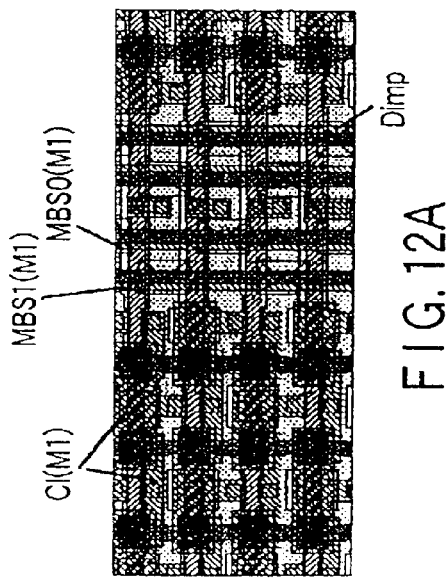
Figure 12C:
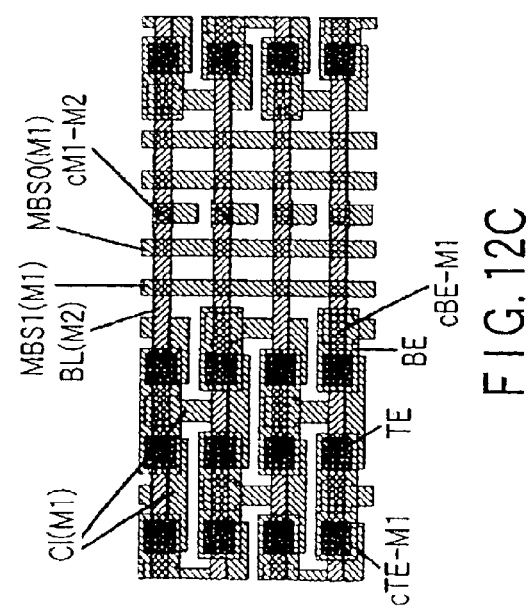
Figure 13A:
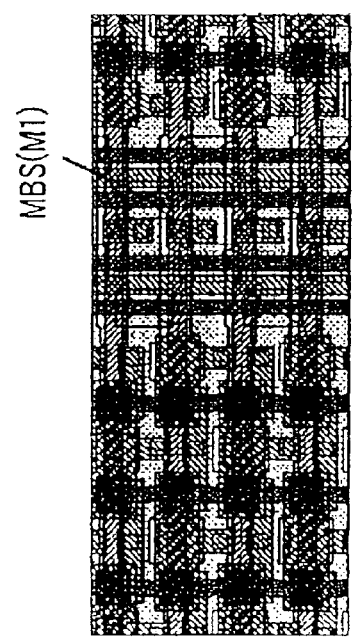
FIGS. 13A to 13D are part of the pattern layout of the cell block for realizing the circuit of FIG. 8A.
Figure 13B:
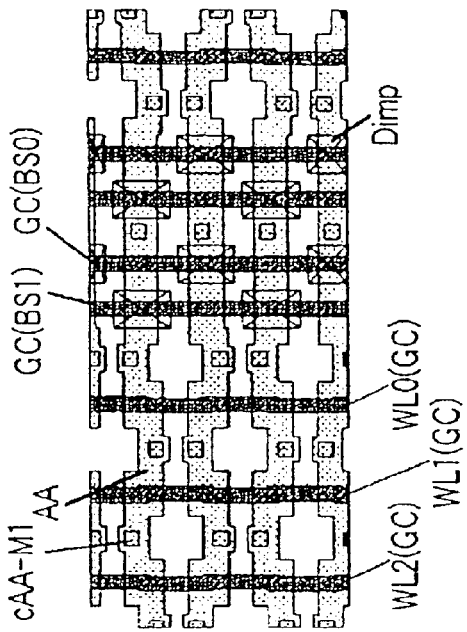
Figure 13C:
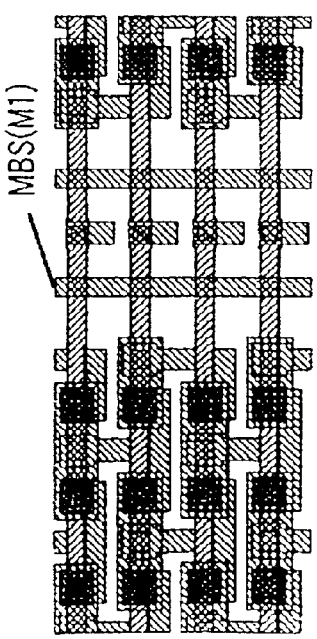
Figure 13D:
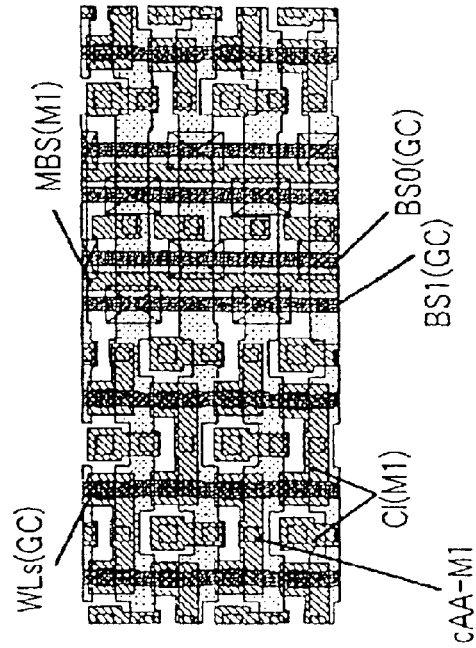

FIG. 11 shows a modification of FIG. 8A according to a second embodiment of this invention. In FIG. 11, portions which are the same as those of FIG. 8A are denoted by the same reference symbols and the detail explanation thereof is omitted. The fourth embodiment has the same effect as that obtained in FIG. 8A. Further, in comparison with the case of FIG. 8A, the degree of freedom for design is enhanced by passing two main-block selecting lines MBS0 and MBS1, MBS2 and MBS3, on the cell blocks, and as a result, the area of the circuit and the number of elements of the sub-row decoder SRD can be reduced.

Figure 14:
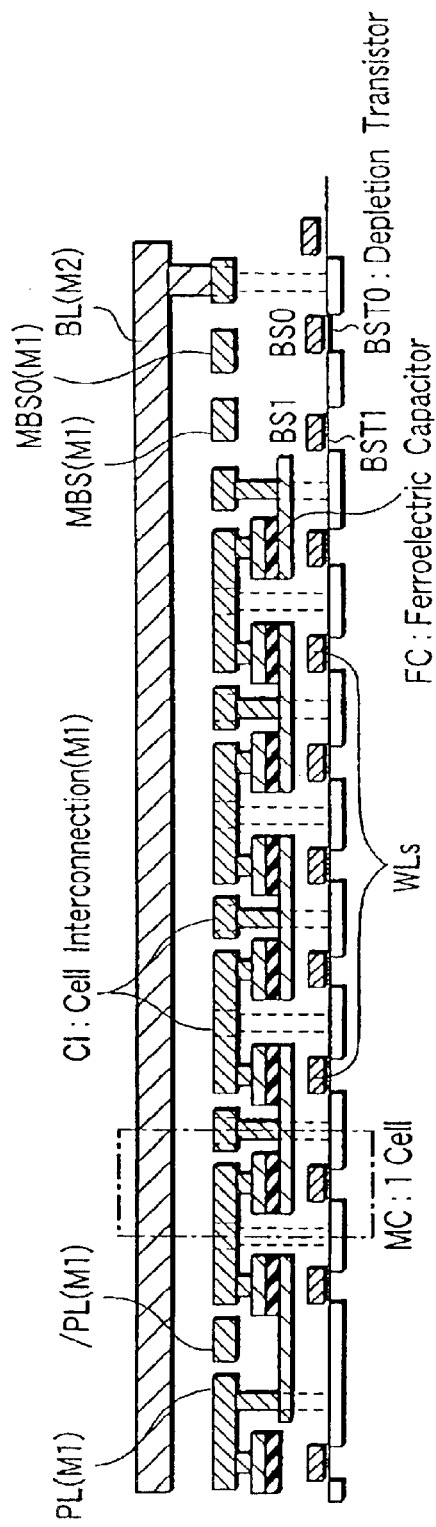
FIG. 14 is a cross section of FIGS. 12A to 12D.
Figure 15:
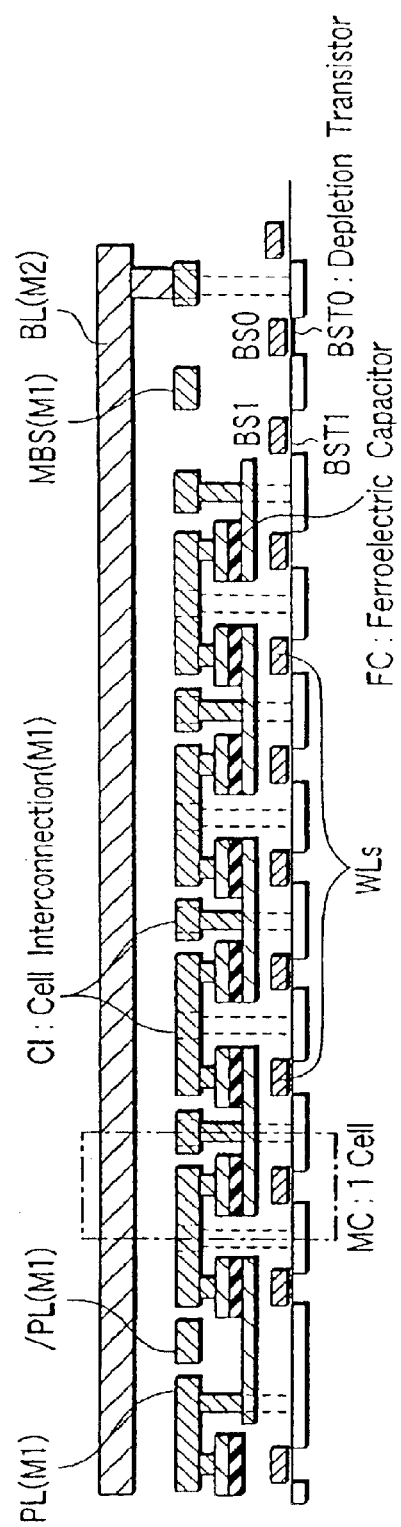
FIG. 15 is a cross section of FIGS. 13A to 13D.
Figures 17A, 17B, 17C, 17D:
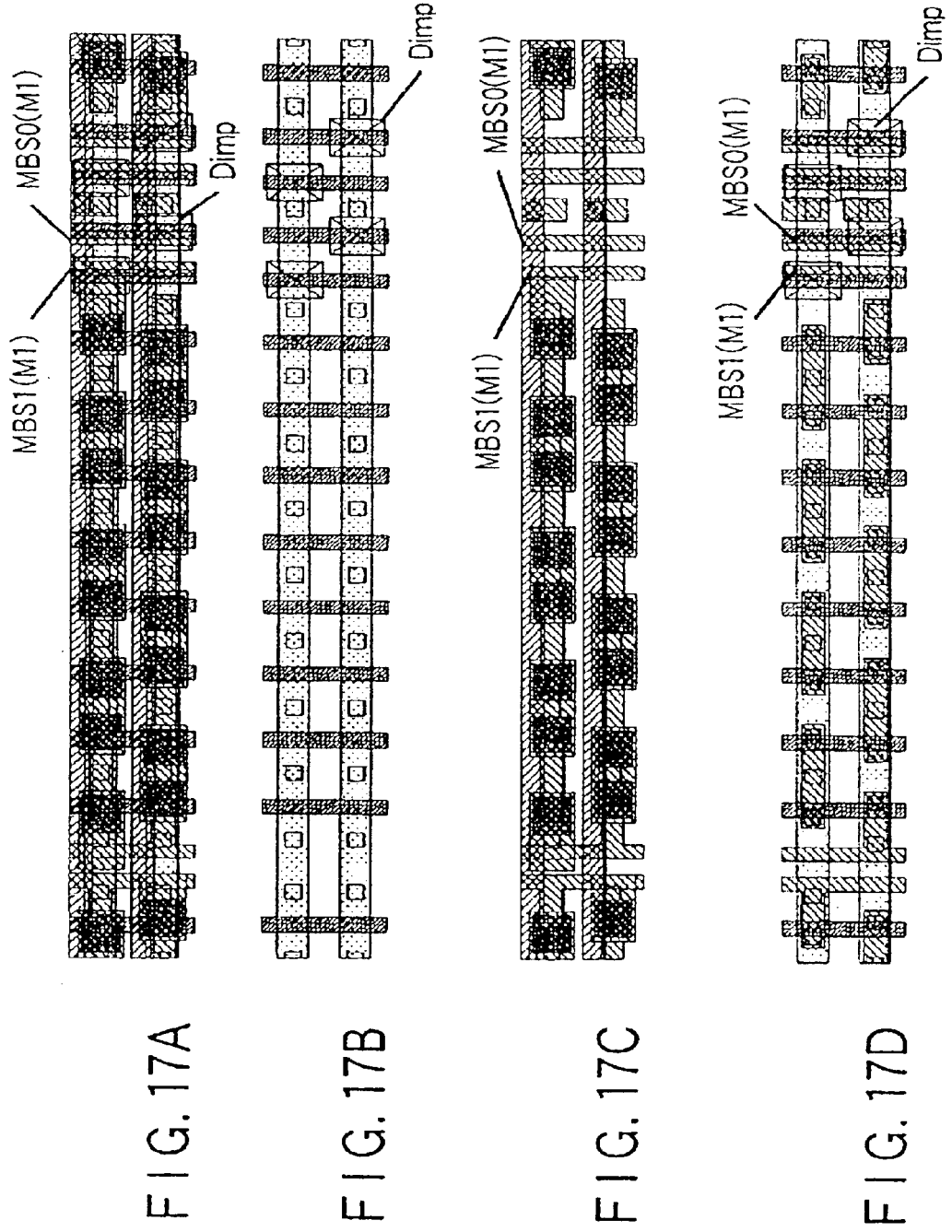
FIGS. 17A to 17D are cell block layout diagrams of a ferroelectric memory according to a fourth embodiment of this invention.
Figures 18A, 18B, 18C, 18D:
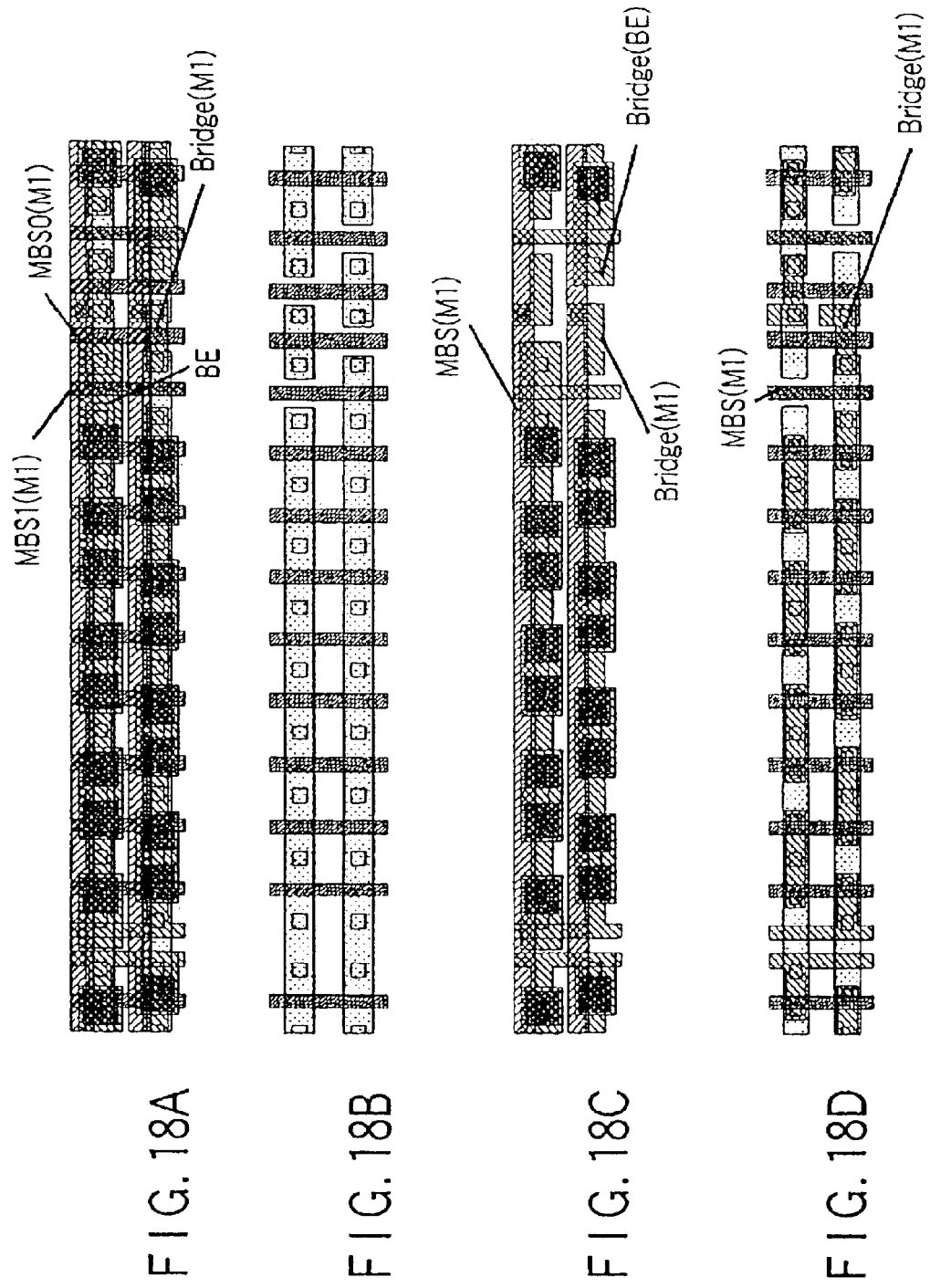
FIGS. 18A to 18D are cell block layout diagrams of a ferroelectric memory according to a fifth embodiment of this invention.
Figures 20A, 20B, 20C, 20D:
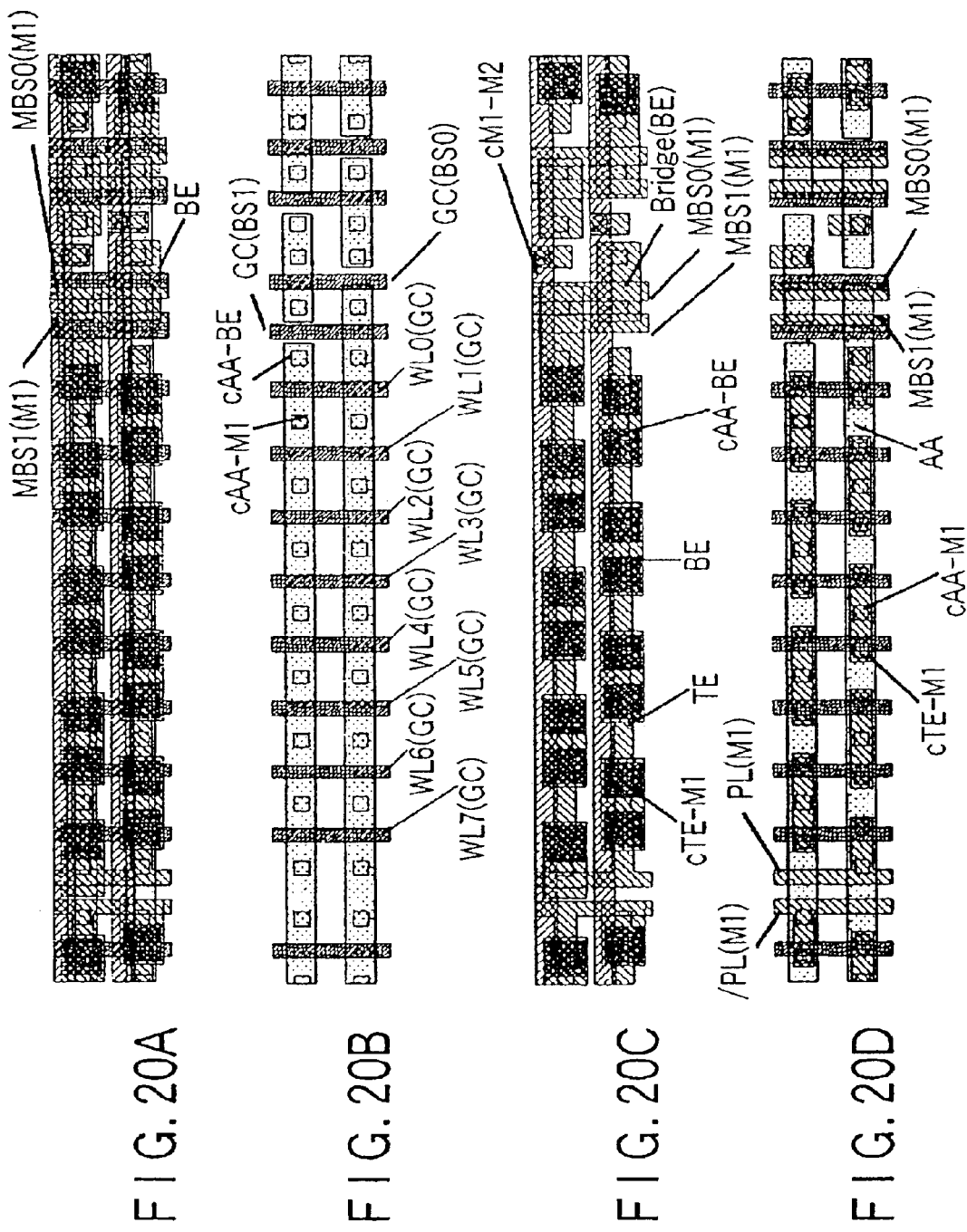
FIGS. 20A to 20D are cell block layout diagrams of a ferroelectric memory according to a seventh embodiment of this invention.

FIGS. 12A to 12D show part of the pattern layout of the cell block for realizing the circuit construction of FIG. 11. FIGS. 13A to 13D show part of the pattern layout of the cell block for realizing the circuit of FIG. BA. FIG. 14 shows a cross section of FIGS. 12A to 12D, and FIG. 15 shows a cross section of FIGS. 13A to 13D.

FIGS. 12A to 12D and FIGS. 13A to 13D respectively show the same layout layer as shown in FIGS. 9A to 9D, and in FIGS. 12A, 12B and 12D and FIGS. 13A, 13B and 13D, mask data (Dimp) of depletion implantation for forming a depletion-type transistor whose threshold voltage is negative is present.

In FIGS. 12A to 12D and FIGS. 13A to 13D, the structure of the cell portion is the same as shown in FIGS. 9A to 9D and 10 and is different from the latter in that a large space of an interconnection area for the metal interconnection M1 is provided on the block selecting transistors BST0, BST1.

In the cell portion of FIGS. 12A to 12D, depletion-type (D-type) transistors are used to form the passage block selecting transistor BST0 in order to dispose a plurality of main-block selecting lines MBS0 and MBS1, MBS2 and MBS3, . . . as shown in FIG. 11. That is, it is connected to the bit line BL via the D-type block selecting transistor BST0 instead of the bridge of the metal interconnection M1. Since the threshold voltage of the D-type transistor is negative, a current always flows in the source-drain path of the transistor BST0, and therefore, the bridge of the metal interconnection M1 for connection to the bit line BL becomes unnecessary and a large interconnection area for the metal interconnection M1 as the main-block selecting lines MBS0, MBS1 can be attained.

In the case of FIGS. 13A to 13D, the D-type block selecting transistor BST0 is used and one main-block selecting line MBS is provided with a sufficiently large margin. Thus, the parasitic capacitance of the main-block selecting line can be reduced and a high-speed operation can be attained. In FIGS. 12A to 12D, 13A to 13D, 14 and 15, the other main effects are the same as those obtained in FIGS. 8A, 9A to 9D, 10 and 11.

Figure 21:
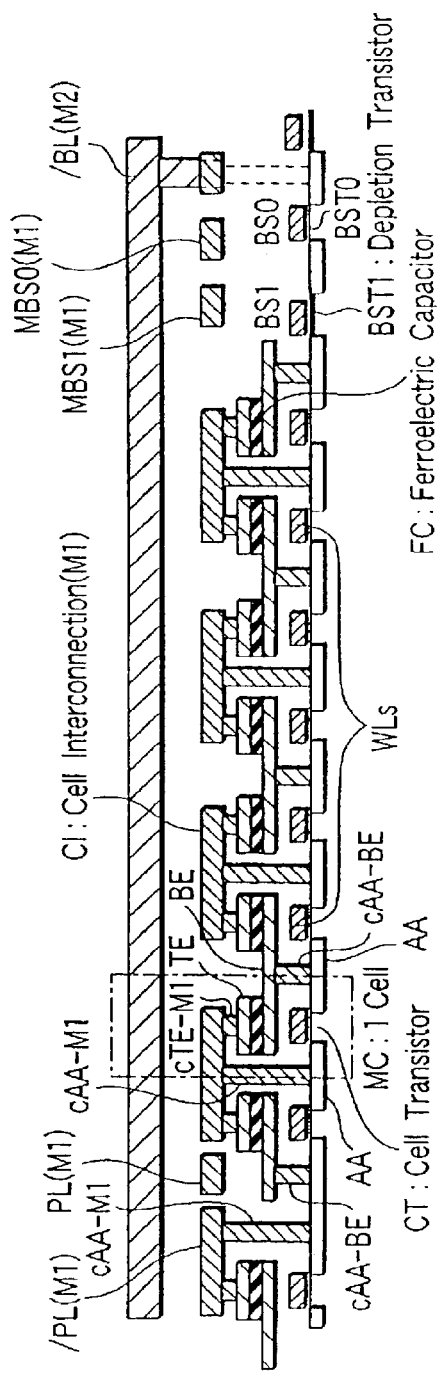
FIG. 21 is a cross sectional view of FIGS. 17A to 17D.
Figure 22:
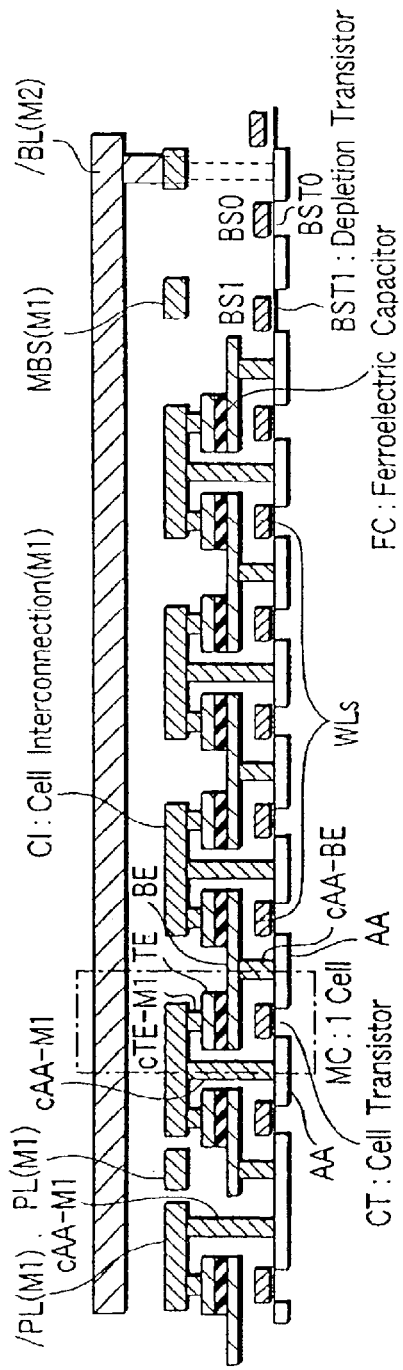
FIG. 22 is a cross sectional view of FIGS. 16A to 16D.

FIGS. 16A to 16D, 17A to 17D, 18A to 18D, 19A to 19D, 20A to 20D are layout plan views respectively showing third to seventh embodiments of this invention and the equivalent circuits shown in FIGS. 8A and 11 can be realized by use of the embodiments. Further, FIG. 21 is a cross sectional view of FIGS. 17A to 17D, FIG. 22 is a cross sectional view of FIGS. 16A to 16D, FIG. 23 is a cross sectional view of FIGS. 20A to 20D, FIG. 24 is a cross sectional view of FIGS. 18A to 18D and 19A to 19D. FIGS. 25A to 25D, 26A to 26D, 27A to 27D are layout plan views showing eighth to tenth embodiments of this invention and the equivalent circuits shown in FIGS. 8A and 11 can be realized by use of the embodiments. The cross sectional views are the same as those of FIGS. 21, 24, and 23. Of course, the main effects thereof are the same as those obtained in FIGS. 8A, 9A to 9D, 10, 11, 12A to 12D, 13A to 13D, 14 and 15.

FIGS. 16A to 16D, 17A to 17D, 18A to 18D, 19A to 19D, 20A to 20D, 21, 22, 23, 24, 25A to 25D, 26A to 26D, 27A to 27D show a case of a stack cell in which a contact is directly made from the bottom electrode BE to the active area AA without using the metal interconnection M1 and the cell size can be reduced because the contact is made without using the contact cBE-M1, metal interconnection M1 and contact cAA-M1.

The cells in FIGS. 25A to 25D, 26A to 26D, 27A to 27D are arranged in the same layout pattern in the adjacent bit line direction and the cells in FIGS. 16A to 16D, 17A to 17D, 18A to 18D, 19A to 19D, 20A to 20D are different from the above cells in that the cells in the adjacent bit line direction are shifted by one pitch of the sub-word lines in the bit line direction. The types of layers and contacts used are the same as those of FIGS. 9A to 9D, 10, 12A to 12D, 13A to 13D, 14 and 15 except that the contact cBE-M1 is omitted and the contact CAA-BE is present.

More specifically, as shown in FIGS. 21 to 24, the bottom electrode BE is connected to the active area AA of the cell transistor CT via the contact cAA-BE, the top electrode TE is connected to the metal interconnection M1 via the contact cTE-M1 and the metal interconnection M1 is connected to active area AA via the contact cAA-M1 to realize the parallel connection of the ferroelectric capacitor FC and the cell transistor CT. The contacts cAA-M1 and cAA-BE are commonly used in the adjacent cells to reduce the cell size.

The configuration of various main-block selecting lines will be explained in more detail. In FIGS. 16A to 16D, a D-type passage block-selecting transistor BST1 is formed in correspondence to a case of FIG. 22, a space for the metal interconnection M1 is provided over the transistor BST1 and the main-block selecting line MBS is formed by use of one metal interconnection M1.

In FIGS. 17A to 17D, a D-type passage block-selecting transistor BST1 is formed in the same manner as in that of FIG. 21, a space for the metal interconnection M1 is provided over the transistor BST1 and the main-block selecting lines MBS0, MBS1 are formed by use of two metal interconnections M1.

Figure 24:
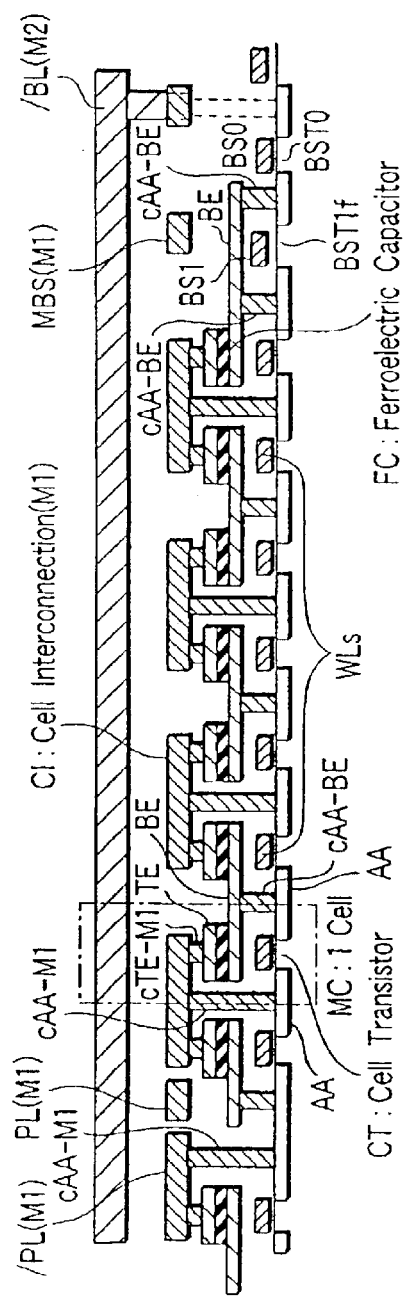
FIG. 24 is a cross sectional view of FIGS. 18A to 18D and 19A to 19D.
Figures 25A, 25B, 25C, 25D:
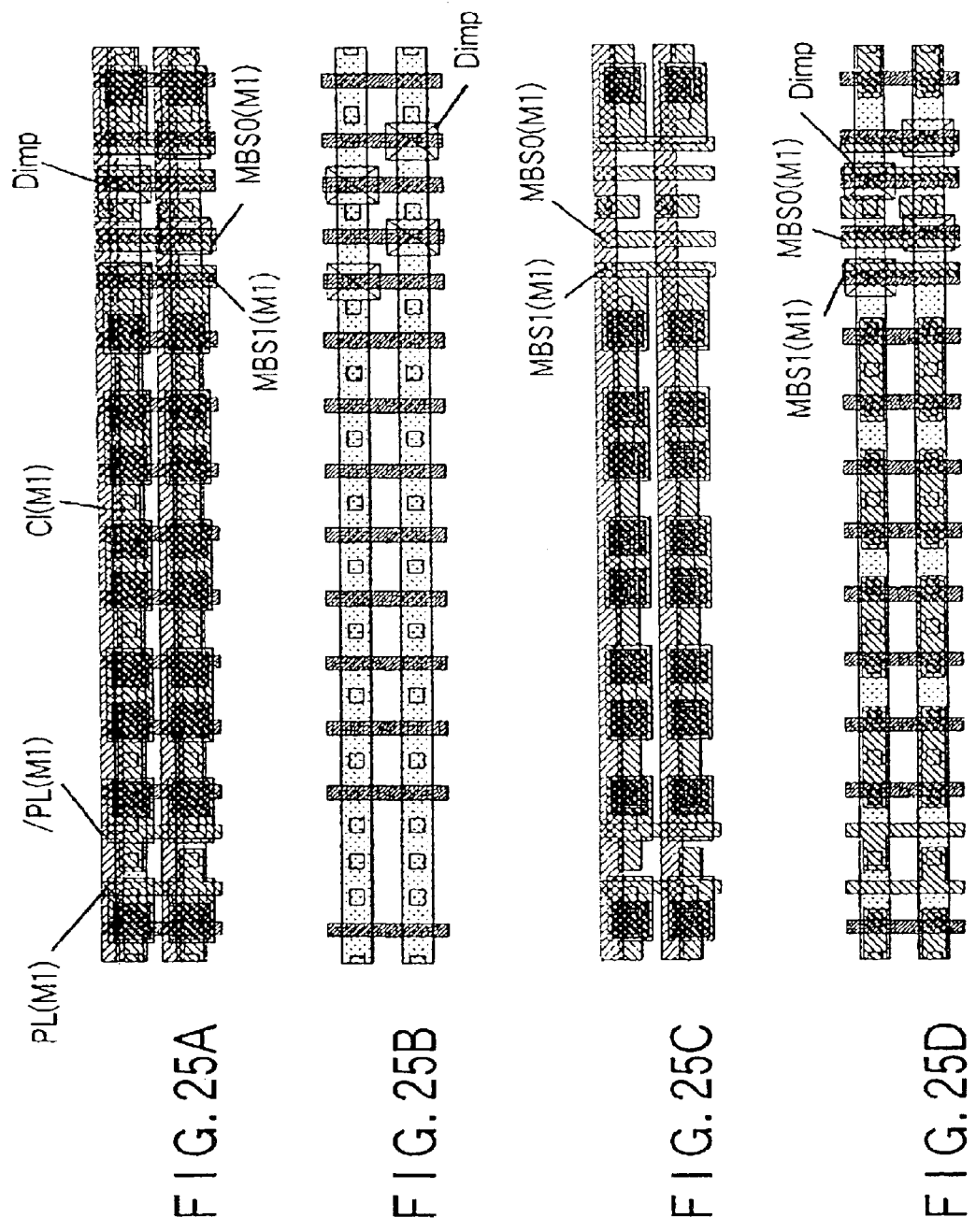
FIGS. 25A to 25D are cell block layout diagrams of a ferroelectric memory according to an eighth embodiment of this invention.
Figures 27A, 27B, 27C, 27D:
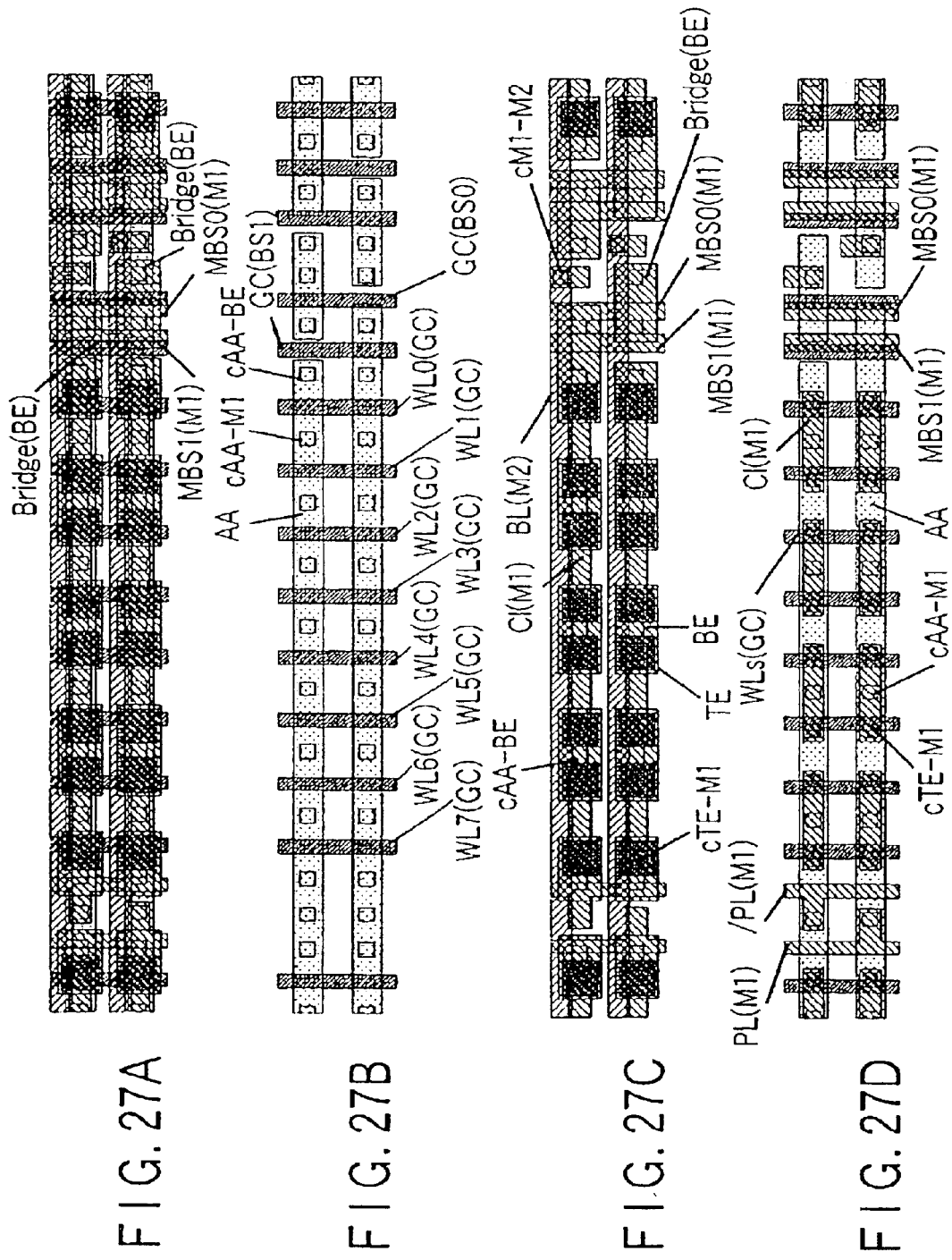
FIGS. 27A to 27D are cell block layout diagrams of a ferroelectric memory according to a tenth embodiment of this invention.

In FIGS. 18A to 18D, 19A to 19D, a contact cAA-BE, bottom electrode BE and the bridge of the contact cAA-BE are formed in the same manner as in those of FIG. 24, a passage block-selecting transistor BST formed of a field transistor is formed, a space area for the metal interconnection M1 is provided over the transistor BST and the main-block selecting line MBS is formed by use of one metal interconnection M1. In FIGS. 18A to 18D, both of the bridge of the metal interconnection M1 and the bridge of the bottom electrode BE are used.

Figure 23:
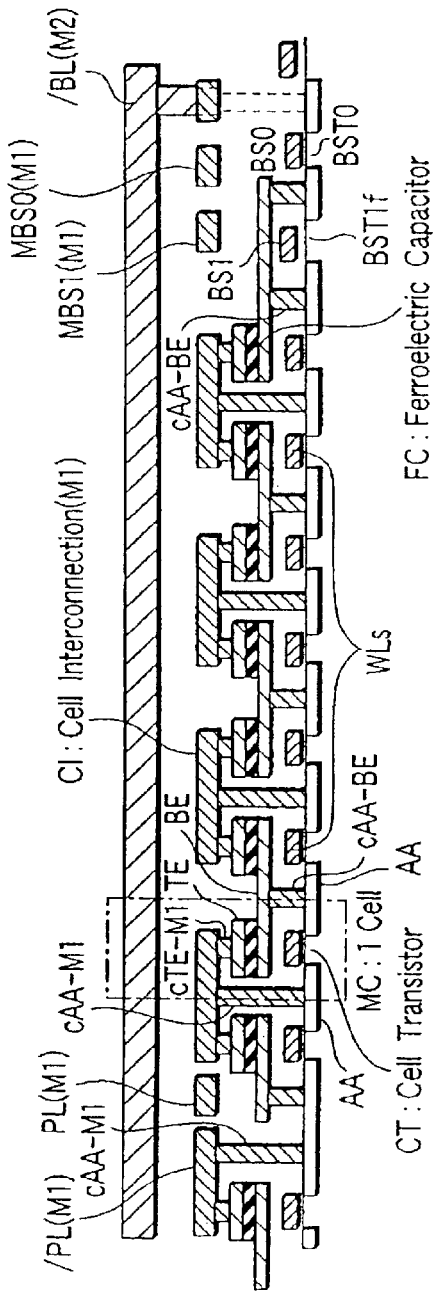
FIG. 23 is a cross sectional view of FIGS. 20A to 20D.

In FIGS. 20A to 20D, a contact cAA-BE, bottom electrode BE and the bridge of the contact CAA-BE are formed in the same manner as those of FIG. 23, a passage block-selecting transistor BST formed of a field transistor is formed, a space for the metal interconnection M1 is formed over the transistor BST and the main-block selecting lines MBS0, MBS1 are formed by use of two metal interconnections M1.

In FIGS. 25A to 25D, a D-type passage block-selecting transistor is formed in correspondence to a case of FIG. 21, a space for the metal interconnection M1 is formed over the transistor and the main-block selecting lines MBS0, MBS1 are formed by use of two metal interconnections M1. Of course, it is possible to use one main-block selecting line.

In FIGS. 26A to 26D, a contact CAA-BE, bottom electrode BE and the bridge of the contact cAA-BE are formed the same manner to those of FIG. 24, a passage block-selecting transistor formed of a field transistor is formed, a space area for the metal interconnection M1 is formed over the transistor and the main-block selecting line MBS is formed by use of one metal interconnection M1. Further, the bridge of the metal interconnection M1 and the bridge of the bottom electrode BE are both used.

In FIGS. 27A to 27D, a contact cAA-BE, bottom electrode BE and the bridge of the contact cAA-BE are formed in the same manner to those of FIG. 23, a passage block-selecting transistor formed of a field transistor is formed, a space for the metal interconnection M1 is formed over the transistor and the main-block selecting lines MBS0, MBS1 by use of two metal interconnections M1 are formed.

Of course, the above embodiments of this invention can be variously modified. For example, the construction obtained by forming the first metal interconnection M1 after the second metal interconnection M2 is formed does not depart from the sprit of the present invention in that the cell interconnection, plate lines and main-block selecting lines are formed of the same interconnection layer.

Figure 1:
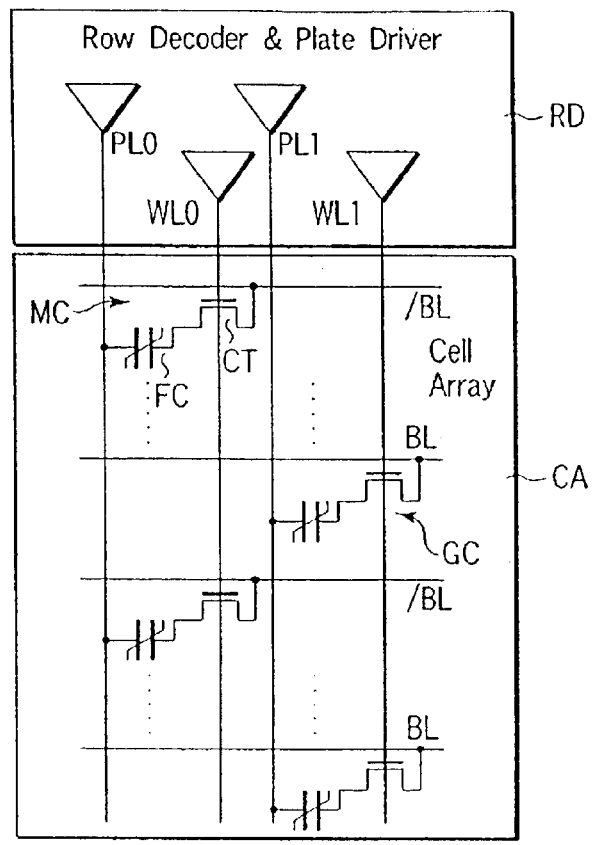
FIG. 1 is a circuit diagram showing an extracted part of the conventional ferroelectric memory.
Figure 2:
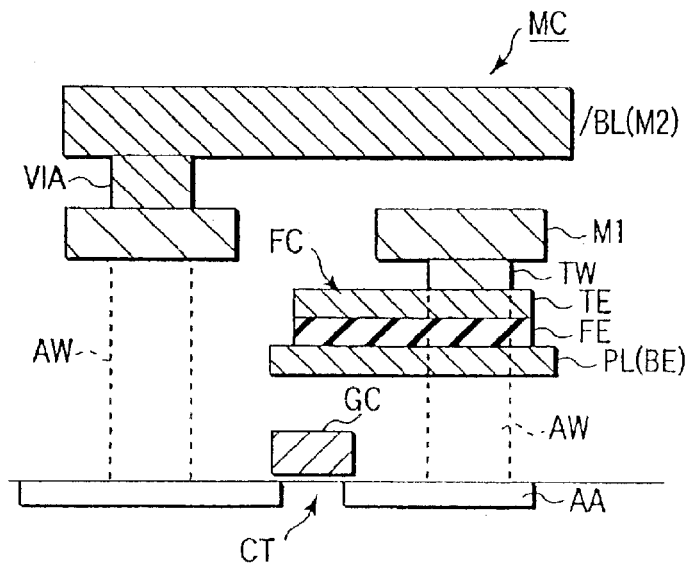
FIG. 2 is a cross sectional view showing a memory cell of the conventional ferroelectric memory.
Figure 3:
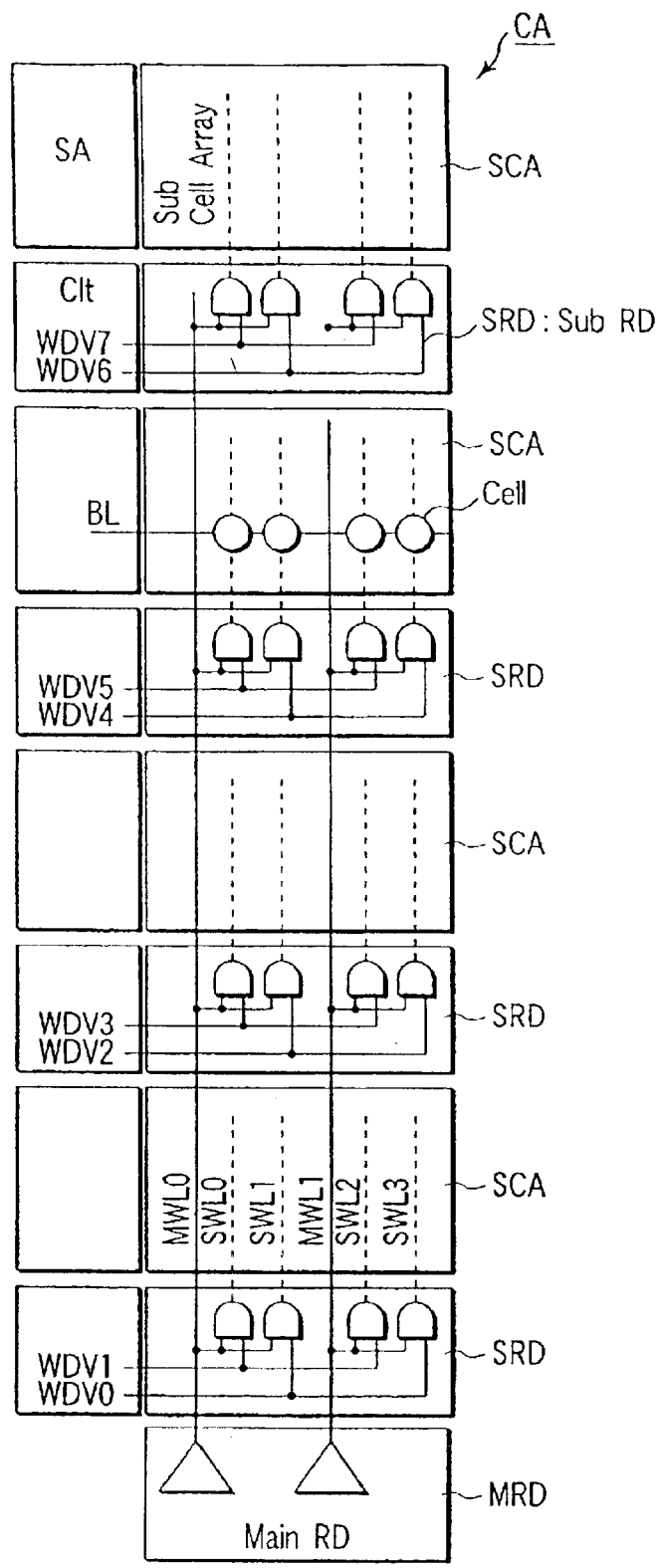
FIG. 3 is a block diagram showing a case wherein a hierarchical word line is constructed in the conventional ferroelectric memory.
Figure 4:
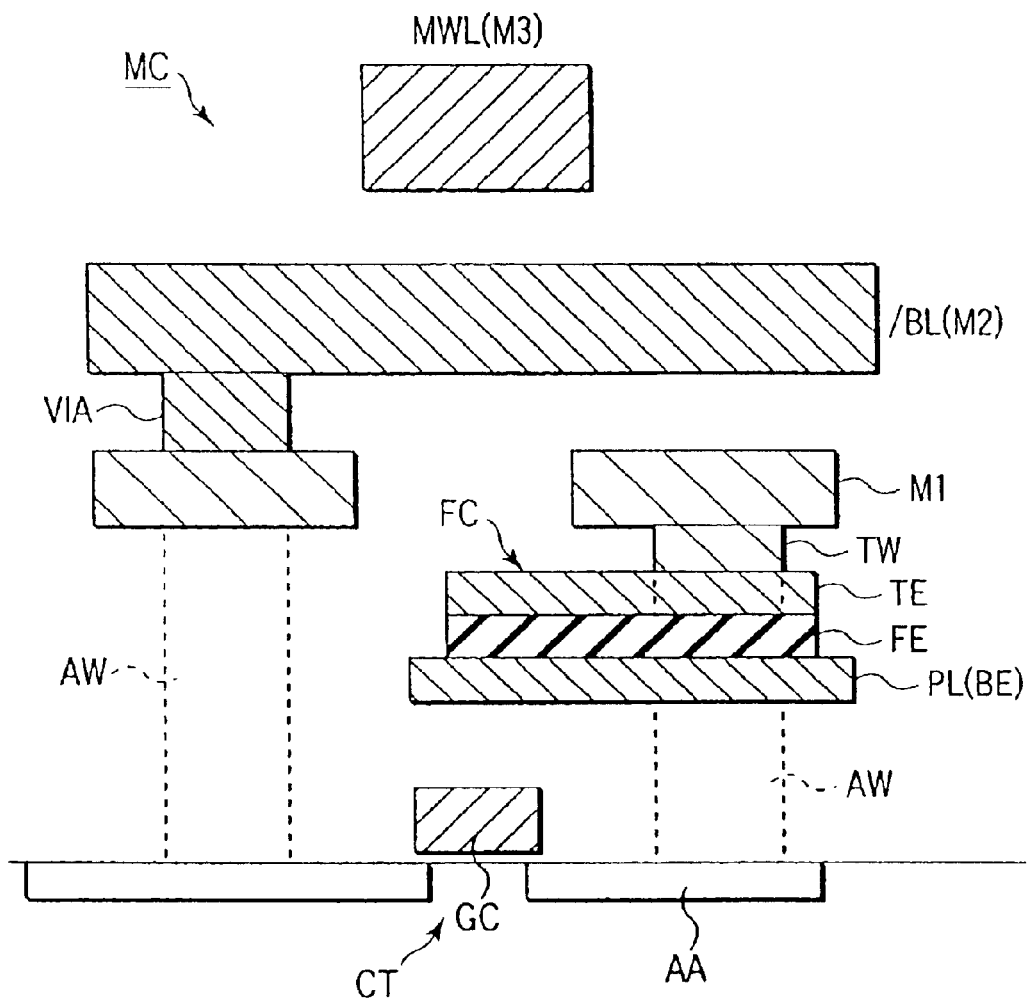
FIG. 4 is a cross sectional view of a memory cell in a case wherein a hierarchical word line is constructed in the conventional ferroelectric memory.
Figure 5A:
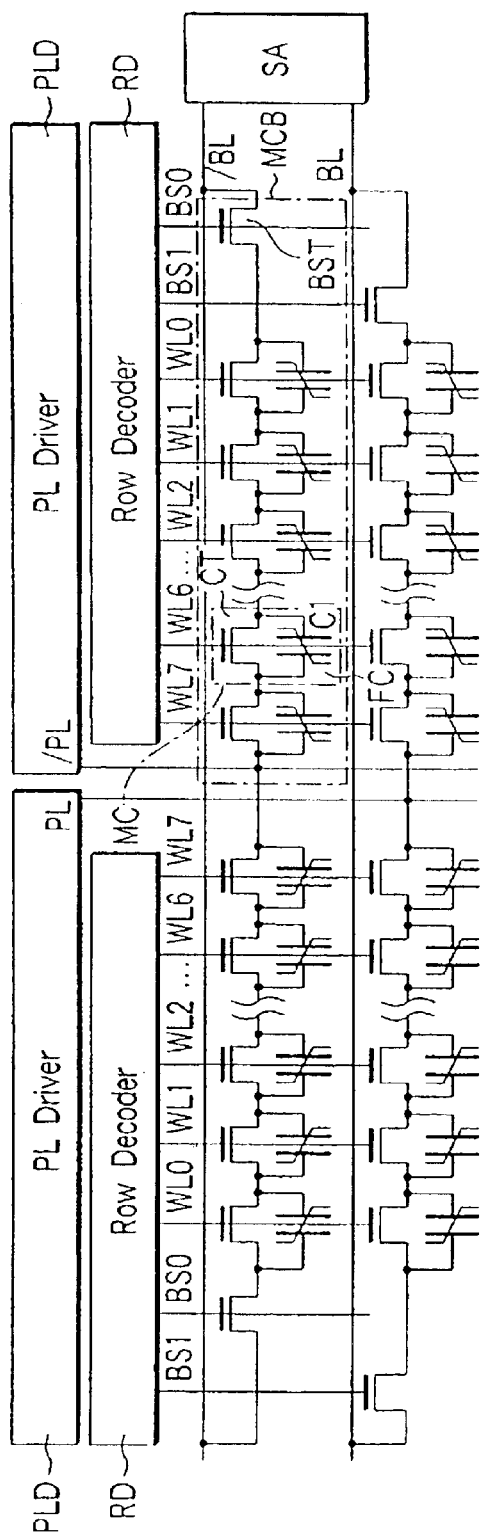
FIG. 5A is a circuit diagram for illustrating the cell block construction of the ferroelectric memory disclosed in the prior application.
Figure 5B:
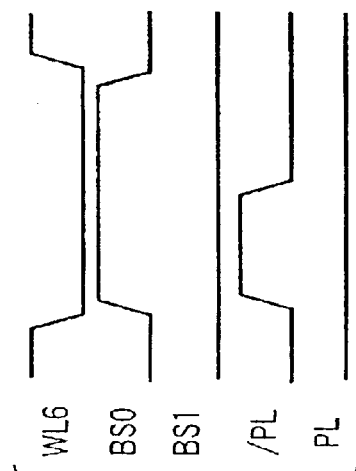
FIG. 5B is a timing chart for illustrating an example of the operation of the ferroelectric memory disclosed in the prior application.
Figure 6:
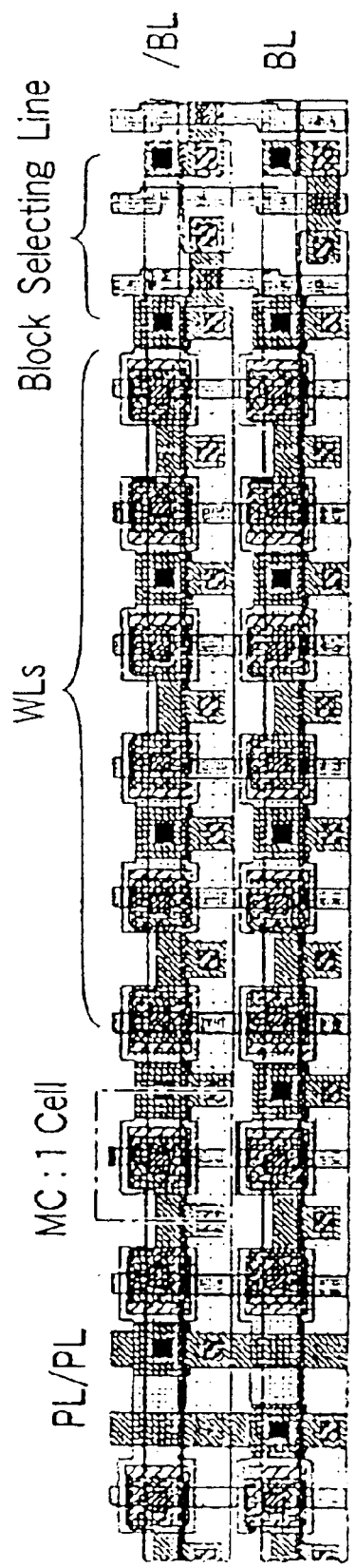
FIG. 6 is a cell block layout diagram of the ferroelectric memory disclosed in the prior application.
Figure 7:
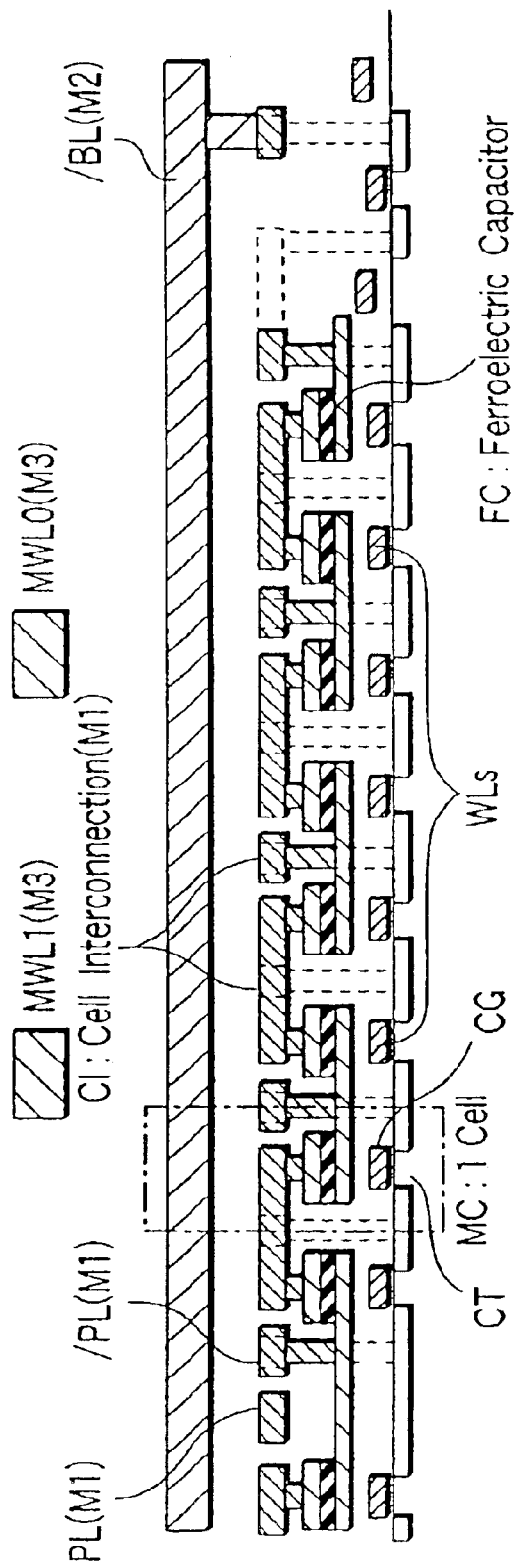
FIG. 7 is a cross sectional view showing a case wherein a hierarchical word line is applied to the cell block of the ferroelectric memory disclosed in the prior application.

In FIGS. 16A to 16D, 17A to 17D, 18A to 18D, 19A to 19D, 20A to 20D, 21 to 24, 25A to 25D, 26A to 26D and 27A to 27D, a new invention is added to the above invention. Of course, since the stack cell structure in which connection is made from the bottom electrode BE to the active area AA via the contact CAA-BE is obtained, the contact cBE-M1 can be omitted and the cell size can be reduced, but when attention is paid to the whole cell block and if the plate lines PL, /PL of the metal interconnection M1 are connected to the cell at the last end as shown in FIGS. 6 and 7 explained with respect to the prior application, it becomes necessary to form a contact (cBE-M1) to extend from the metal interconnection M1 to the bottom electrode BE of the cell at the last end. Particularly, in the folded bit line configuration, since it is necessary to alternately connect the two plate lines PL, /PL to the last ends of the adjacent cell blocks, the bridge of the bottom electrode BE is required. That is, if a contact cBE-M1 is required for connection with the plate lines PL, /PL even though the contact cBE-M1 can be omitted for the cell, the process cost cannot be lowered. Further, since the contact cBE-M1 is formed by forming a ferroelectric film, forming an opening in the film and filling a conductive material in the opening, damage occurs therein and degrades the characteristic of the ferroelectric film.

In order to solve the above problem, in FIGS. 16A to 16D, 17A to 17D, 18A to 18D, 19A to 19D, 20A to 20D, 21 to 24, 25A to 25D, 26A to 26D and 27A to 27D, for example, as shown in the plate line contact portion of FIG. 21, the bottom electrode BE of the cell at the last end of the cell block is connected to the active area AA via the contact cAA-BE and then connected from the active area AA to the plate line /PL (M1) via the contact cAA-M1, thereby making it possible to omit the contact cBE-M1. At this time, the size overhead can be suppressed to a minimum and the folded bit line configuration can be realized by passing the plate line PL formed of the metal interconnection M1 over the contact cAA-BE. According to the above embodiments, since the contacts cBE-M1 can be completely eliminated, the cost can be lowered and an increase in the area can be suppressed without causing damage.

Particularly, in the embodiments shown in FIGS. 16A to 16D, 17A to 17D, 18A to 18D, 19A to 19D and 20A to 20D, since a passage of the plate line PL formed of the metal interconnection M1 over the contact cAA-BE can be made symmetrical for adjacent blocks which are alternately arranged, contacts in the plate contact portion can be obtained by forming only two contacts (one contact cAA-M1 and one contact cAA-BE) for the adjacent blocks. In the case of FIGS. 25A to 25D, 26A to 26D and 27A to 27D, three contacts are required (one contact cAA-M1 and two contacts cAA-BE). The construction can be realized at the same time as the formation of the hierarchical block selecting system of this invention or separately realized from the latter. In the above cross sectional views, broken lines indicate cross sections in a position slightly deviated in the sub-word line direction.

Figure 28:
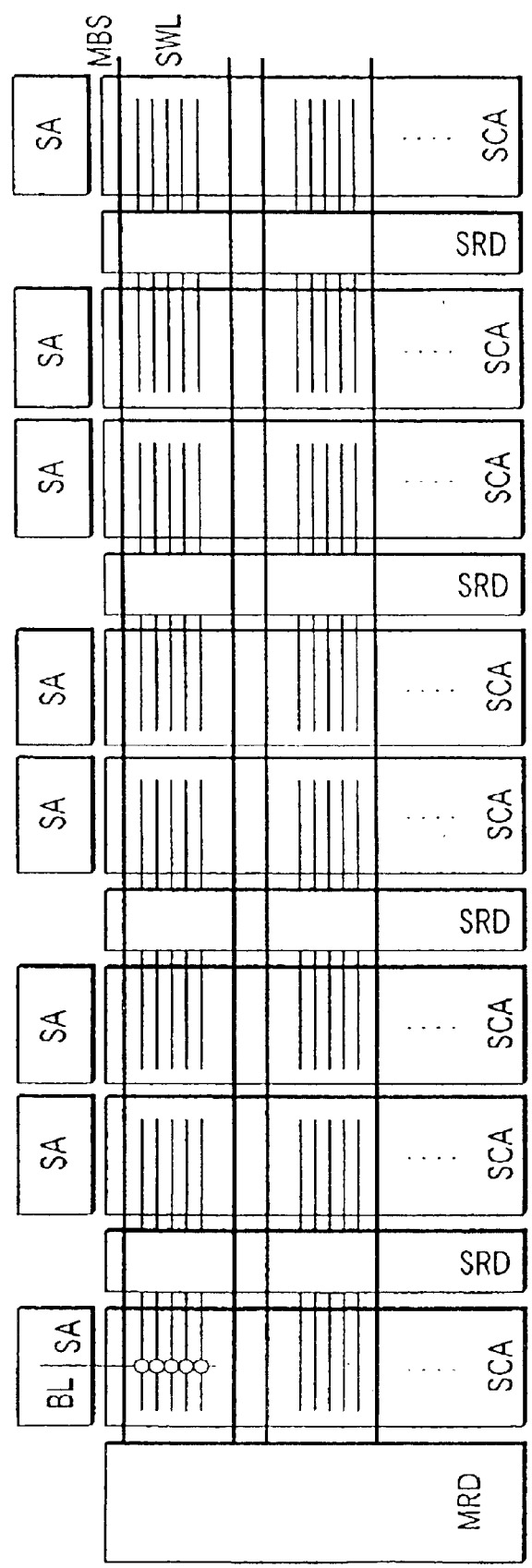
FIG. 28 is a block layout diagram showing a hierarchical block line system according to an eleventh embodiment of this invention.
Figure 29:
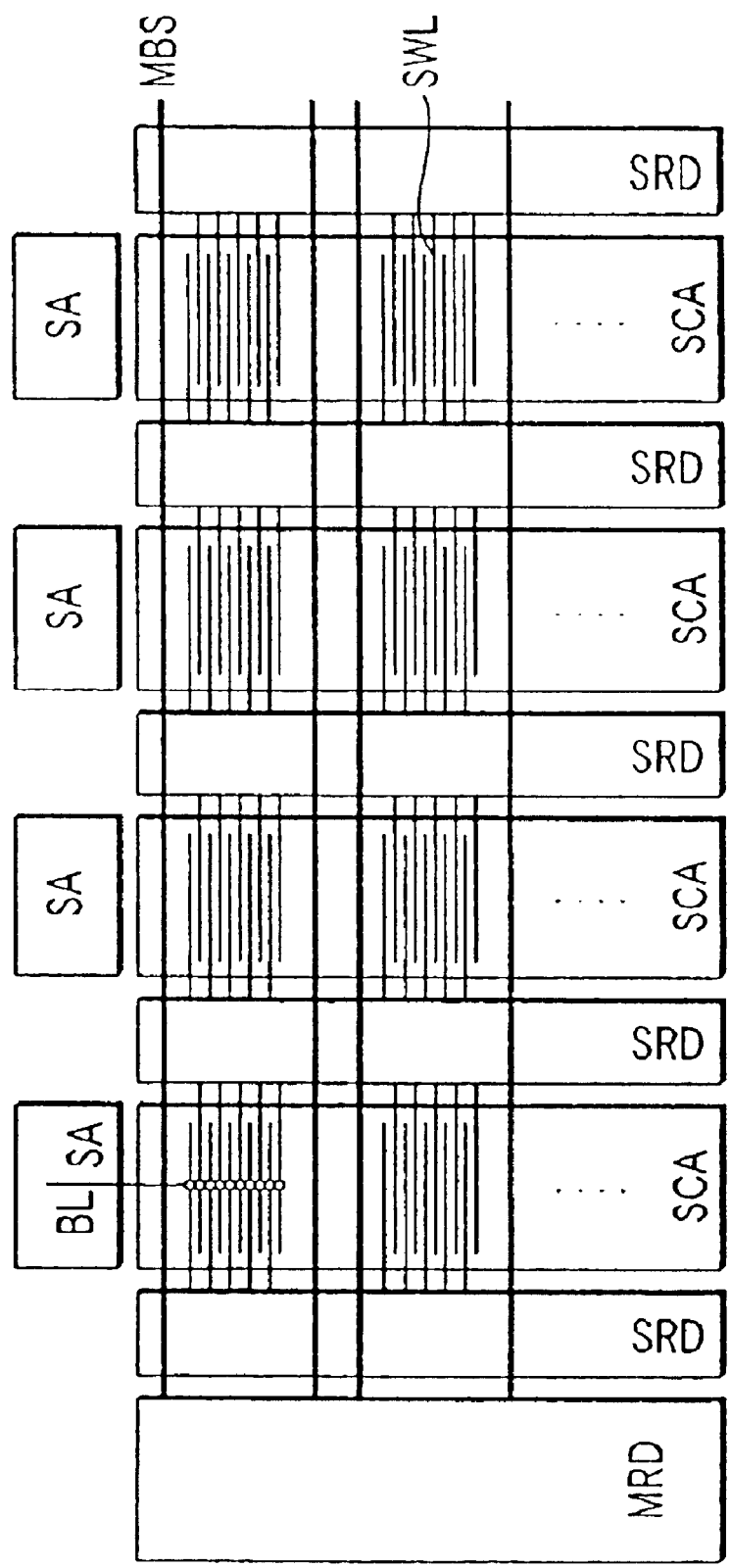
FIG. 29 is a block layout diagram showing a hierarchical block line system according to a twelfth embodiment of this invention.

FIGS. 28 and 29 show eleventh and twelfth embodiments of this invention and show modifications of FIG. 8A. The main effect is the same as that obtained in the case of FIG. 8A. In FIG. 28, outputs of sub-word lines from each of sub-row decoders SRD provided between respective sub-arrays SCA are lead out from both sides of the sub-row decoder SRD to the sub-arrays SCA arranged on both sides of the sub-row decoder SRD. With this construction, a word line driving circuit can be commonly used by the sub-arrays SCA arranged on both sides of the sub-row decoder SRD. Thus, the number of circuit elements can be reduced.

As in the case of FIG. 28, in FIG. 29, outputs of sub-word lines SWL from each sub-row decoder SRD provided between respective sub-arrays SCA are lead out from both sides of the sub-row decoder SRD to the sub-arrays SCA arranged on both sides of the sub-row decoder SRD. With this construction, a word line driving circuit can be used in common by the sub-arrays SCA arranged on both sides of the sub-row decoder SRD and the sub-word lines SWL of the sub-array SCA are alternately driven by use of the word line driving circuits arranged on both sides of the sub-array SCA in order to alleviate the circuit layout pitch of the word line driving circuits. Likewise, a sub-plate line driving circuit for driving sub-plate lines can be used in common and the sub-plate lines can be alternately driven by use of sub-plate line driving circuits.

In FIGS. 28 and 29, MRD denotes a main row decoder, MBS denotes a main-block selecting line, SA denotes a sense amplifier and BL denotes a bit line.

Figure 30:
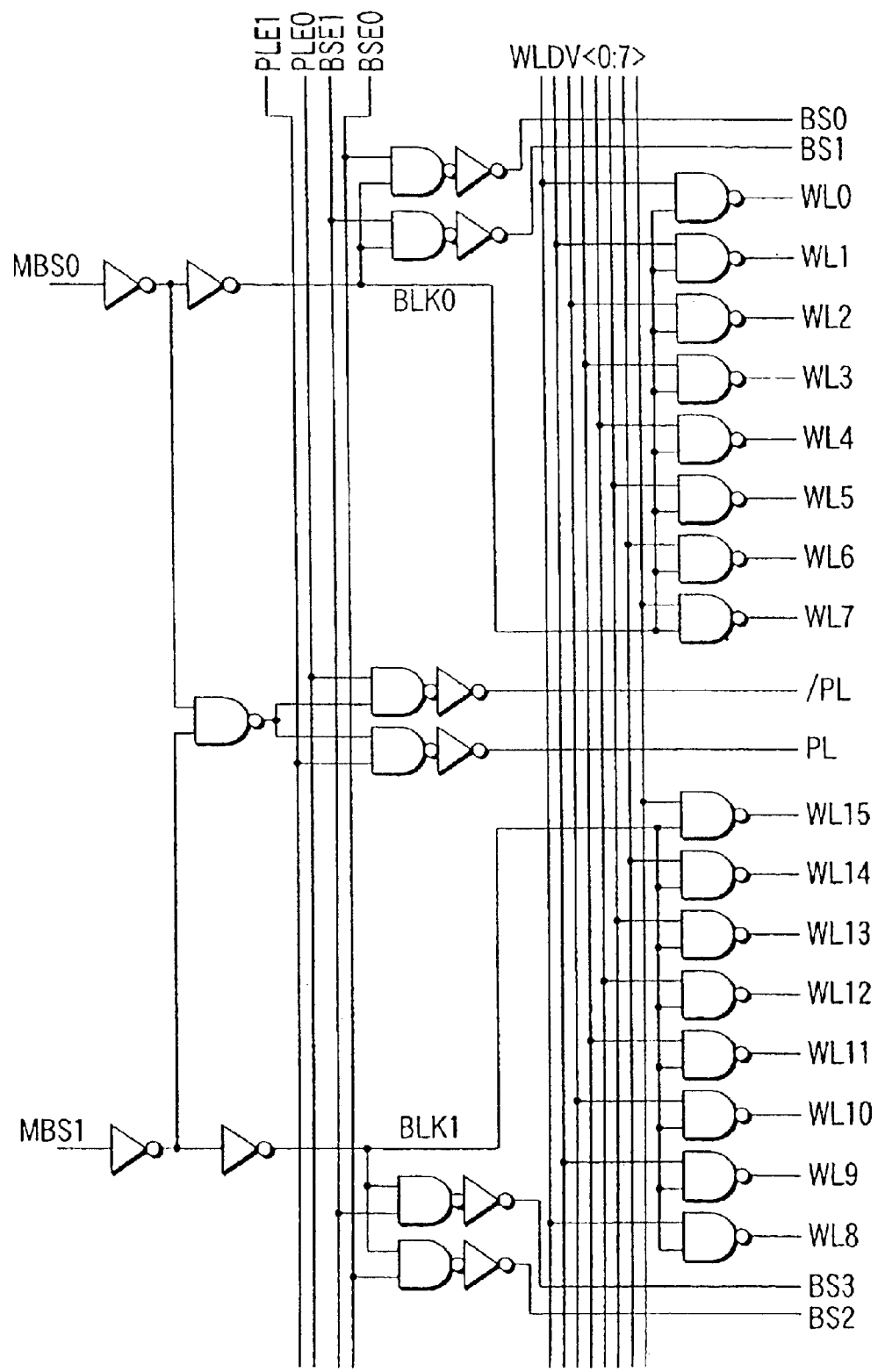
FIG. 30 is a circuit diagram of a sub-row decoder shown in FIG. 8A.
Figure 31:
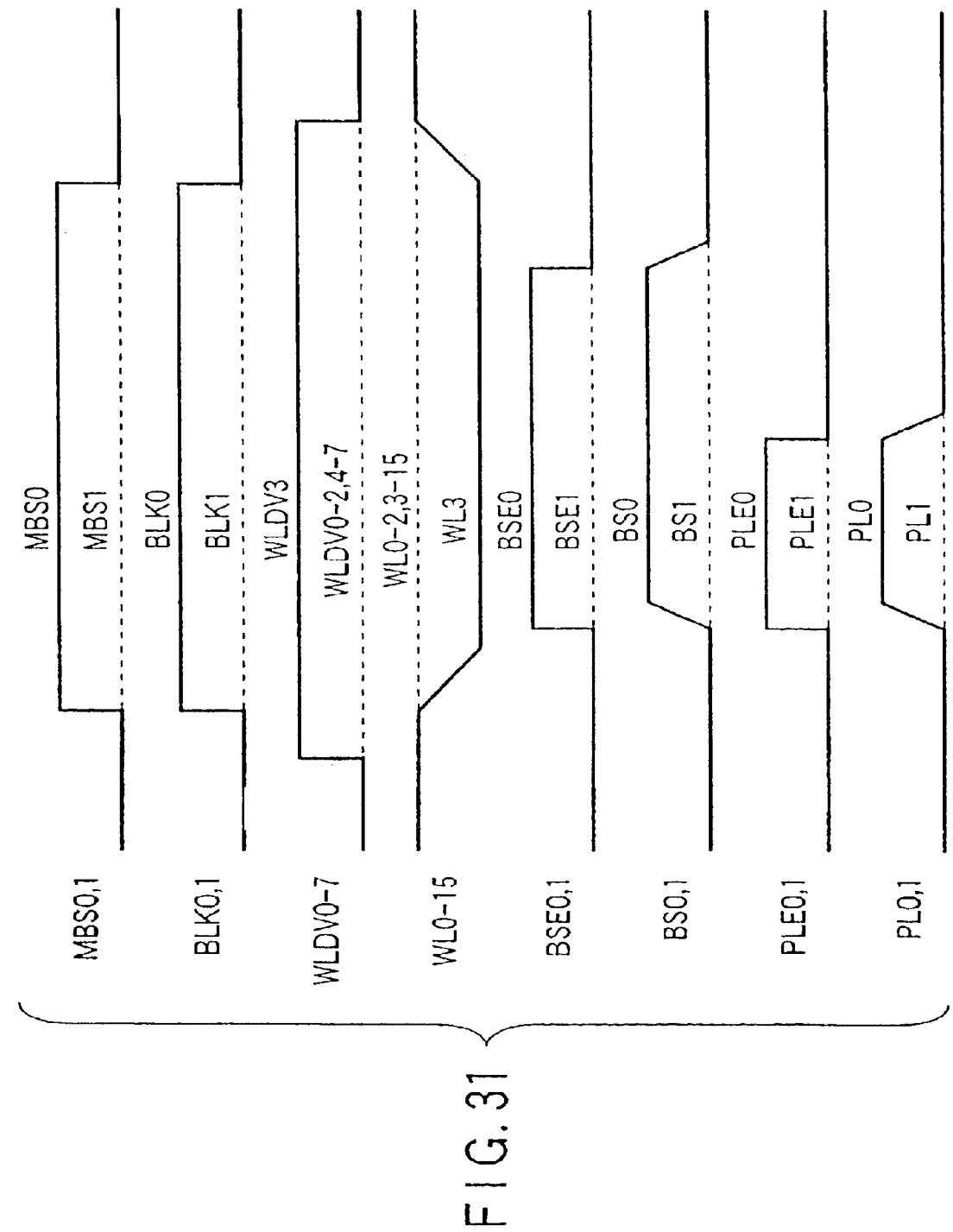
FIG. 31 is a timing chart for illustrating the operation of a sub-row decoder shown in FIG. 30.

FIG. 30 shows an example of the circuit construction of the sub-row decoder (sub RD) in FIG. 8A. FIG. 31 illustrates an example of the concrete operation of the circuit of FIG. 30. In a cell block selected from a plurality of cell blocks, if a main-block selecting line MBS0 is set to the high level and a word line driving signal line WLDV3 for selecting a sub-word line from eight sub-word lines WL0 to WL7 in the cell block is set to the high level, only the sub-word line WL3 is lowered from the high level to the low level and the cell transistor in a selected cell is turned OFF. After this, if a plate selection driving signal PLE0 and block selection driving signal BSE0 on the bit line /BL side are set to the high level, the block selecting line BS0 and plate line PL0 are set to the high level since the main-block selecting line MBS0 is set at the high level, and thus cell data is read out to the bit line. At this time, if the plate selection driving signals PLE0, PLE1 and block selection driving signals BSE0, BSE1 are all set to the high level, the block selecting lines BS0, BS1 and plate lines PL0, PL1 are all set to the high level and the 2T2C operation can be attained. In this case, since the plate signal is commonly used by the adjacent cell blocks, the circuit is designed so as to be operated when a corresponding one of the main-block selecting lines MBS0 and MBS1 is set to the high level.

FIG. 32 shows an example of the circuit construction of the sub-row decoder portion of FIG. 8A. The circuit is almost the same as that of FIG. 30, but in this circuit, the number of elements in the sub-row decoder can be reduced by utilizing the fact that the main-block selecting lines MSB0, MSB1 are provided two for each cell block, reducing the number of plate selection driving signals PLE0, PLE1 for selecting a different plate line for the bit line /BL or BL to one, omitting the circuit for deriving the logical OR of signals of the main-block selecting lines MBS0 and MBS1 so as to permit one of the adjacent cell blocks to be directly selected, and mounting a circuit for setting the main-block selecting line MBS1 to the high level when the bit line /BL is selected and setting the main-block selecting line MBS3 to the high level when the bit line BL is selected on the main row decoder.

Figure 34:
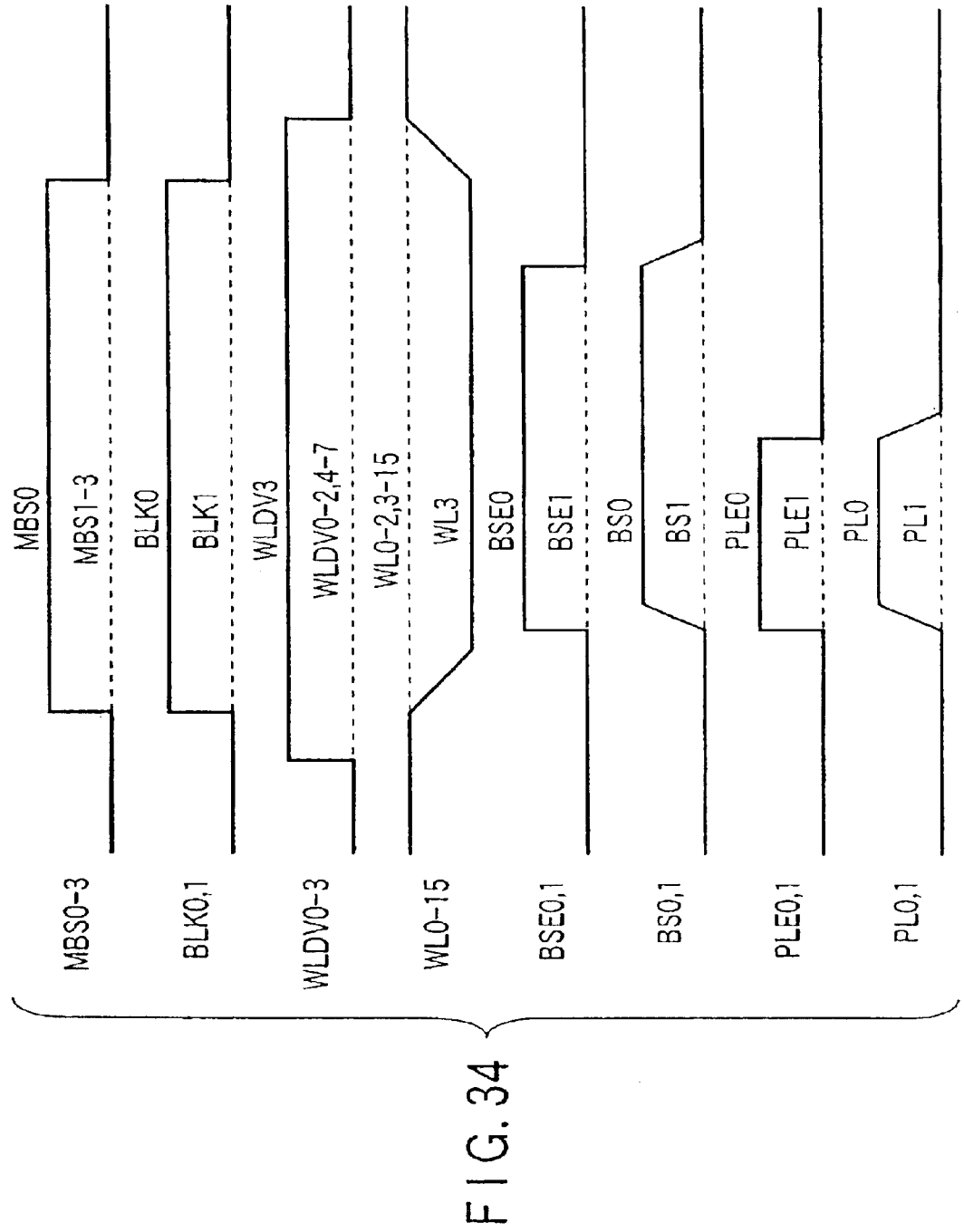
FIG. 34 is a timing chart for illustrating the operation of a sub-row decoder shown in FIG. 33.

FIG. 33 shows another example of the circuit construction of the sub-row decoder SRD in FIG. 11. FIG. 34 illustrates an example of the concrete operation of the circuit of FIG. 33. Based on the fact that the number of main-block selecting lines is increased to two for each cell block, a control operation is effected to select word lines WL0 to WL3 when a main-block selecting line MBS0 is selected and select word lines WL4 to WL7 when a main-block selecting line MBS1 is selected. Therefore, the number of word line driving signal lines WLDVi (i=0, 1, 2, . . . ) which is eight in the case of FIG. 30 can be reduced to four.

This invention has been explained by use of the embodiments, but is not limited to them and can be variously modified without departing from the technical scope thereof. Further, the above embodiments contain inventions at various stages and various inventions can be made by adequately combining a plurality of constituents disclosed. For example, in a case wherein at least one of the problems described in the specification can be solved and at least one of the effects described in the specification can be attained even if some constituents are omitted from the entire constituents indicated in the above embodiments, the construction obtained by omitting the above constituents can be extracted as an invention.

As described above, according to one aspect of one aspect of this invention, the hierarchical word line system and hierarchical block selecting line system which can be easily formed by use of nonvolatile plane transistors and realize high integration while the random access function can be maintained can be attained without increasing the number of interconnection layers, that is, raising the process cost, since the main-block selecting line for connecting the main row decoder to the sub-row decoder can be formed by use of the same interconnection layer as the plate interconnection and metal interconnection used between the memory cells in the cell block. Thus, the area of the decoder can be significantly reduced and the chip size can be reduced.

Further, by applying the above system, the sub-array size can be reduced based on the fact that the area of the sub-row decoder is reduced without raising the process cost, and as a result, the power consumption can be lowered and a high operation speed due to a reduction in the delay time of the word line can be attained.

Further, since the bottom electrode of the ferroelectric capacitor can be connected to the diffusion layer without using a metal interconnection formed at the higher level in the whole cell block, the contact between the bottom electrode and the metal interconnection can be omitted and deterioration of the ferroelectric capacitor due to the process damage caused by formation of the contact can be prevented, while the cost is lowered.

Therefore, a semiconductor memory device to which the hierarchical word line system and hierarchical block selecting line system can be applied to reduce the chip area and lower the process cost without increasing the number of interconnection layers can be provided.

Further, a semiconductor memory device which can be highly integrated and easily produced, with a high-speed random access function, in which the chip area can be further reduced and process cost lowered can be provided.

What is claimed is:

1. A semiconductor memory device comprising:

a memory cell array which includes a plurality of sub-arrays, a plurality of sub-row decoders provided between said plurality of respective sub-arrays, for driving a plurality of sub-word lines, a main row decoder disposed on one-end side of said plurality of sub-arrays in a sub-word line direction, and a plurality of main-block selecting lines for respectively supplying outputs of said main row decoder to said sub-row decoders;

wherein said plurality of sub-arrays each include said plurality of sub-word lines, a plurality of bit lines, a plurality of plate lines and a plurality of memory cell blocks, said plurality of sub-arrays are arranged in said sub-word line direction, a metal interconnection used for forming said plate lines and a metal interconnection used for forming said main-block selecting lines are formed by metal interconnection layers at the same level, said memory cell blocks each include a plurality of series-connected memory cells and at least one selection transistor serially connected to at least one end of said series-connected portion, one end of each of said memory cell blocks is coupled to a corresponding one of said bit lines, the other end thereof is connected to a corresponding one of said plate lines, a gate terminal of each cell transistor is connected to a corresponding one of said sub-word lines, said memory cell includes said cell transistor and a ferroelectric capacitor connected between source and drain terminals of said cell transistor, and a metal interconnection used for parallel connection of said cell transistor and said ferroelectric capacitor is formed by a metal interconnection layer formed at the same level as said plate lines and said main-block selecting lines.

* * * * *